United States Patent
Kameda et al.

(10) Patent No.: US 10,156,012 B2
(45) Date of Patent: Dec. 18, 2018

(54) CLEANING METHOD, METHOD OF MANUFACTURING SEMICONDUCTOR DEVICE, SUBSTRATE PROCESSING APPARATUS, AND A NON-TRANSITORY COMPUTER-READABLE RECORDING MEDIUM

(71) Applicants: HITACHI KOKUSAI ELECTRIC INC., Tokyo (JP); CENTRAL GLASS CO., LTD., Ube-shi, Yamaguchi (JP)

(72) Inventors: Kenji Kameda, Toyama (JP); Masaya Nagato, Toyama (JP); Akiou Kikuchi, Ube (JP); Yuta Takeda, Ube (JP); Kunihiro Yamauchi, Ube (JP)

(73) Assignees: KOKUSAI ELECTRIC CORPORATION, Tokyo (JP); CENTRAL GLASS CO., LTD., Ube (JP)

( * ) Notice: Subject to any disclaimer, the term of this patent is extended or adjusted under 35 U.S.C. 154(b) by 0 days.

(21) Appl. No.: 15/695,423

(22) Filed: Sep. 5, 2017

(65) Prior Publication Data
US 2018/0057936 A1 Mar. 1, 2018

Related U.S. Application Data

(63) Continuation of application No. PCT/JP2016/055872, filed on Feb. 26, 2016.

(30) Foreign Application Priority Data

Mar. 2, 2015 (JP) .................................. 2015-040734

(51) Int. Cl.
C23C 16/44 (2006.01)
C23C 16/52 (2006.01)
(Continued)

(52) U.S. Cl.
CPC .......... *C23C 16/4405* (2013.01); *C23C 16/40* (2013.01); *C23C 16/402* (2013.01);
(Continued)

(58) Field of Classification Search
None
See application file for complete search history.

(56) References Cited

U.S. PATENT DOCUMENTS

2001/0017143 A1* 8/2001 Bergman ............. B08B 3/08
134/3
2012/0270409 A1* 10/2012 Kim ............. H01L 21/02189
438/763
(Continued)

FOREIGN PATENT DOCUMENTS

JP H03-094059 A 4/1991

*Primary Examiner* — Alexander Ghyka
(74) *Attorney, Agent, or Firm* — Oliff PLC

(57) ABSTRACT

There is provided a cleaning method improving cleaning efficiency in a process container after an oxygen-containing film forming process is having performed, including: (a) supplying at least a hydrogen fluoride gas into the process container; and (b) supplying an alcohol into the process container in a state where supply of the hydrogen fluoride gas into the process container is stopped, wherein (a) and (b) are continuously performed without providing an intermittent period therebetween.

15 Claims, 10 Drawing Sheets

(51) Int. Cl.
*C23C 16/40* (2006.01)
*C23C 16/455* (2006.01)
(52) U.S. Cl.
CPC .. *C23C 16/45523* (2013.01); *C23C 16/45525* (2013.01); *C23C 16/52* (2013.01)

(56) References Cited

U.S. PATENT DOCUMENTS

2013/0256803 A1* 10/2013 Clark .............. H01L 21/823842
257/368
2017/0260626 A1* 9/2017 Nagato ................ C23C 16/401

* cited by examiner

CLEANING METHOD, METHOD OF MANUFACTURING SEMICONDUCTOR DEVICE, SUBSTRATE PROCESSING APPARATUS, AND A NON-TRANSITORY COMPUTER-READABLE RECORDING MEDIUM

BACKGROUND

Technical Field

The present disclosure relates to a method of cleaning, a method of manufacturing a semiconductor device, a substrate processing apparatus, and a non-transitory computer-readable recording medium.

Description of Related Art

As one of the processes for manufacturing a semiconductor device, there may be a process of forming an oxygen-containing film on a substrate in a process container. During this film forming process, deposits including an oxygen-containing film are adhered to an interior of the process container. Therefore, a cleaning process of removing the deposits adhered to the interior of the process container is performed by supplying a cleaning gas into the process container after the film forming process is having performed.

SUMMARY

The present disclosure provides a technique capable of improving a cleaning efficiency in a process container after the oxygen-containing film forming process is having performed.

According to an aspect of the present disclosure, there is provided a method of cleaning an interior of a process container after having performed a process of forming an oxygen-containing film on a substrate, including:

(a) supplying at least a hydrogen fluoride gas into the process container; and (b) supplying an alcohol into the process container in a state where supply of the hydrogen fluoride gas into the process container is stopped, wherein (a) and (b) are continuously performed without providing an intermittent period therebetween.

According to the present disclosure, there is provided a technique capable of improving cleaning efficiency in the process container after the oxygen-containing film forming process is having performed.

DETAILED DESCRIPTION

An Embodiment of the Present Disclosure

An embodiment of the present disclosure will be described hereafter, with reference to FIG. 1 to FIG. 3.

(1) Configuration of Substrate Processing Apparatus

Figure 1:
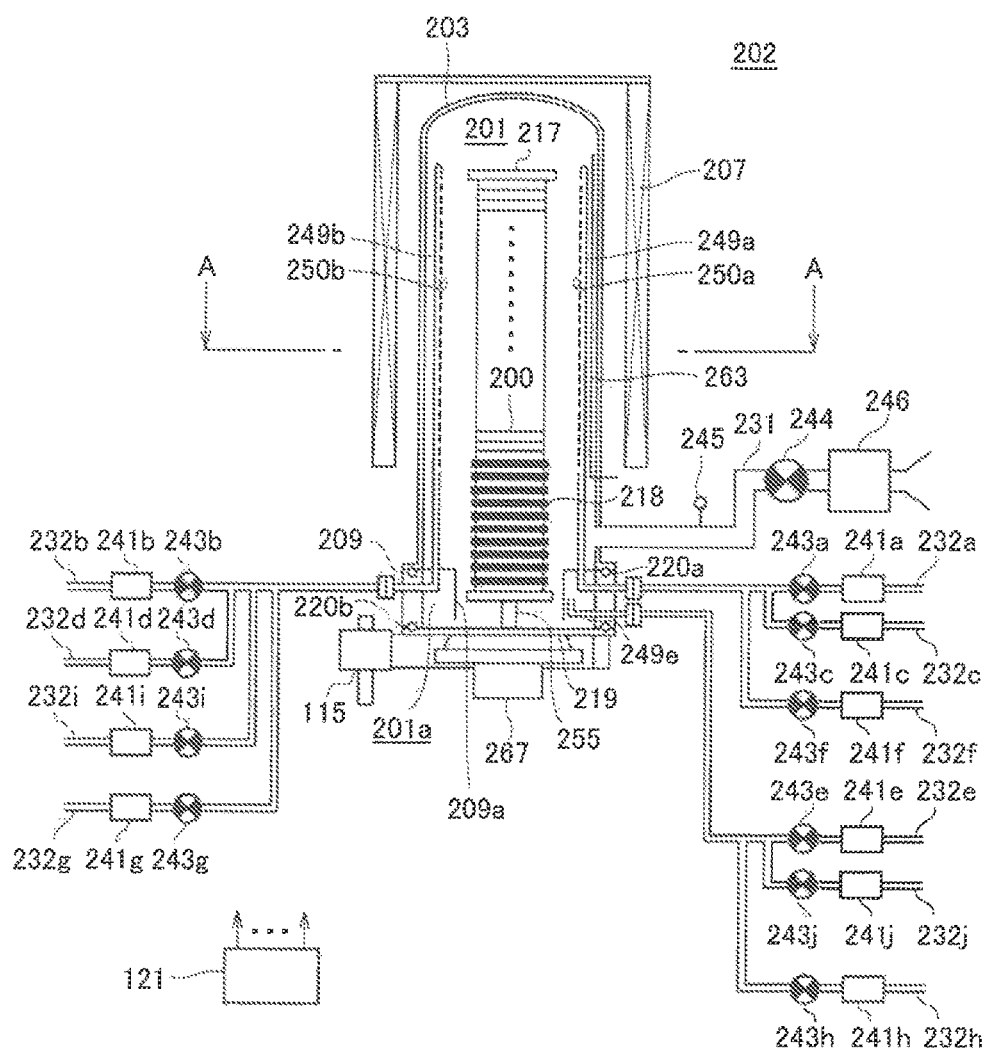
FIG. 1 is a schematic view illustrating a configuration of a vertical processing furnace of a substrate processing apparatus suitably used in one embodiment of the present disclosure, the processing furnace being shown in a longitudinal sectional view.
Figure 2:
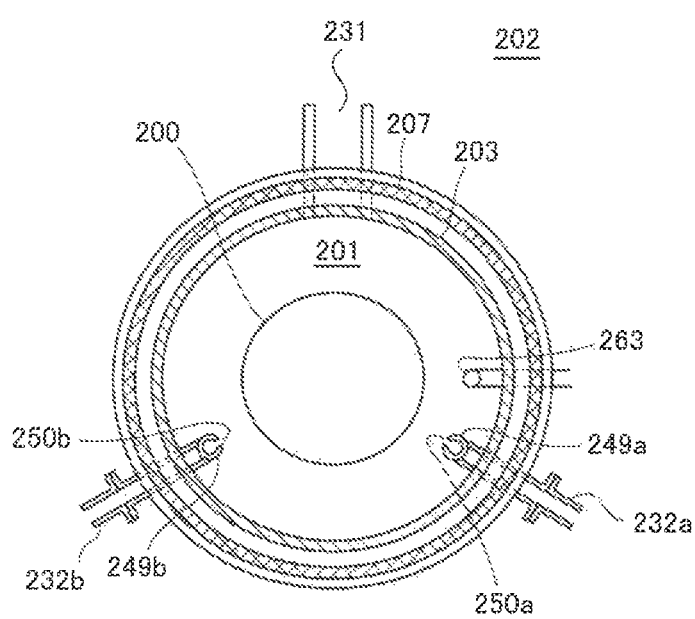
FIG. 2 is a schematic view illustrating a configuration of the vertical processing furnace of the substrate processing apparatus suitably used in the embodiment of the present disclosure, the processing furnace being shown in a sectional view taken along a line A-A in FIG. 1.

As shown in FIG. 1, a processing furnace 202 includes a heater 207 as a heating unit (heating mechanism). The heater 207 has a cylindrical shape and is vertically installed by being supported on a heater base (not shown) as a support plate. The heater 207 also serves as an activating mechanism (exciting unit) to activate (excite) a gas with heat, which will be described later.

A reaction tube 203 is provided to an inside of the heater 207 coaxially with the heater 207. The reaction tube 203 is made of a heat resistant material such as quartz ($SiO_2$) or silicon carbide (SiC), and is formed into a cylindrical shape with its upper end closed and its lower end opened. A manifold (inlet flange) 209 is provided under the reaction tube 203 coaxially with the reaction tube 203. The manifold 209 is made of, for example, a metal such as stainless steel (SUS), and is formed into a cylindrical shape with its upper and lower ends opened. An upper end portion of the manifold 209 engages with a lower end portion of the reaction tube 203, and is configured to support the reaction tube 203. An O-ring 220a as a seal member is installed between the manifold 209 and the reaction tube 203. The reaction tube 203 is set in a vertically installed state by supporting the manifold 209 on the heater base. A process container (reaction container) is mainly constituted of the reaction tube 203 and the manifold 209. A process chamber 201 is formed in a hollow cylindrical portion of the process container. The process chamber 201 is configured so that a plurality of wafers 200 as substrates can be housed in a state of being arranged in a horizontal posture vertically in multiple stages by a boat 217 described later. A cover 209a is installed to an inner peripheral part of the manifold 209. The cover 209a is made of, for example, quartz, SiC, or the like, and installed along an inner wall of the manifold 209 so as to cover the inner wall of the manifold 209.

Nozzles 249a, 249b and 249e are installed in the process chamber 201 so as to penetrate through the manifold 209. The nozzles 249a, 249b and 249e are made of, for example, heat resistant material such as quartz or SiC. Gas supply pipes 232a, 232b and 232e are connected to the nozzles 249a, 249b and 249e, respectively. A gas supply pipe 232c is connected to the gas supply pipe 232a. Gas supply pipes 232d and 232i are connected to the gas supply pipe 232b. A gas supply pipe 232j is connected to the gas supply pipe 232e. In this way, three nozzles 249a, 249b and 249e, and seven gas supply pipes 232a to 232e, 232i and 232j are installed to the reaction container, to thereby configure so that a plurality kinds of gases can be supplied into the process chamber 201.

Mass flow controllers (MFCs) 241a to 241e, 241l and 241j, which are flow rate controllers (flow rate control parts), and valves 243a to 243e, 243i and 243j, which are opening/closing valves, are respectively installed to the gas supply pipes 232a to 232e, 232i and 232j in this order from an upstream side. Gas supply pipes 232f to 232h for supplying an inert gas are respectively connected to the gas supply pipes 232a, 232b and 232e on a downstream side of the valves 243a, 243b and 243e. MFCs 241f to 241h, which are flow rate controllers (flow rate control parts), and valves 243f to 243h, which are opening/closing valves, are respectively installed to the gas supply pipes 232f to 232h in this order from an upstream side.

The nozzles 249a and 249b are respectively connected to leading end portions of the gas supply pipes 232a and 232b. As shown in FIG. 2, the nozzles 249a and 249b are respectively installed in an annular space between an inner wall of the reaction tube 203 and the wafer 200, so as to rise along from a lower part to an upper part of the inner wall of the reaction tube 203, and upward in the arrangement direction of the wafer 200. Namely, the nozzles 249a and 249b are respectively installed in a lateral part of a wafer arrangement region in which the wafers 200 are arranged, in a region horizontally surrounding the wafer arrangement region, and along the wafer arrangement region. Namely, the nozzles 249a and 249b are respectively installed in a lateral part of an end portion (a peripheral edge portion) of each wafer 200 loaded into the process chamber 201, vertically to a surface (flat surface) of the wafer 200. The nozzles 249a and 249b are respectively configured of L-shaped long nozzles. Each horizontal portion of the nozzles 249a and 249b is installed so as to penetrate a sidewall of the manifold 209, and each vertical portion thereof is installed so as to rise from at least one end side of the wafer arrangement region toward the other end side thereof. Gas supply holes 250a and 250b for supplying gas, are respectively formed to side surfaces of the nozzles 249a and 249b. The gas supply holes 250a and 250b are respectively opened so as to face toward the center of the reaction tube 203, and thereby gases can be supplied toward the wafer 200. A plurality of gas supply holes 250a and 250b are formed so as to extend from a lower part to an upper part of the reaction tube 203, and have the same opening area, and further at the same opening pitch.

Thus, in this embodiment, the gas is transferred via the nozzles 249a and 249b installed to the inside of an annular vertically extending space, i.e., a cylindrical space defined by the inner wall of the reaction tube 203 and an end portion (a peripheral edge part) of the plurality of wafers 200 arranged in the reaction tube 203. The gas is first ejected in the vicinity of the wafer 200, into the reaction tube 203 through the opened gas supply holes 250a and 250b of the nozzles 249a and 249b respectively. Then, a main flow of the gas in the reaction tube 203 is set in a direction parallel to the surface of the wafer 200, namely, in a horizontal direction. With this configuration, the gas can be uniformly supplied to the respective wafers 200 and this makes it possible to improve the uniformity of the thickness of a film formed on the respective wafers 200. A gas flowing over the surface of the wafer 200, i.e., a residual gas after the reaction, flows toward an exhaust port, i.e., an exhaust pipe 231 described later. However, a flow direction of the residual gas is not limited to the vertical direction but may be suitably adjusted depending on a position of the exhaust port.

The nozzle 249e is connected to a leading end portion of the gas supply pipe 232e. As shown in FIG. 1, the nozzle 249e is installed so as to inject the gas into an annular space 201a (also referred to as a purging space 201a, hereafter) between the inner wall of the manifold 209 and the cover 209a. The nozzle 249e is configured of L-shaped long nozzles. A horizontal portion of the nozzle 249e is installed so as to penetrate through a sidewall of the manifold 209, and a vertical portion of the nozzle 249e is installed so as to extend upward. The gas supply hole is formed to the leading end portion of the nozzle 249e, which is opened so as to extend upward. This gas supply hole may be formed to the side surface of the leading end portion of the nozzle 249e, and in this case, the gas supply hole is opened toward horizontal direction.

A halosilane source gas containing Si as a certain element and a halogen element, for example, is supplied as a source gas containing certain elements from the gas supply pipe 232a into the process chamber 201 via the MFC 241a, the valve 243a, and the nozzle 249a.

The halosilane source gas may include a halosilane source in a gaseous state, a gas obtained by vaporizing a halosilane source in a liquid state under normal temperature and pressure for example, a halosilane source in a gaseous state under normal temperature and pressure, or the like. The halosilane source is a silane source having a halogen group. The halogen group includes a chloro group, a fluoro group, a bromo group, an iodine group, or the like. Namely, the halogen group contains a halogen element such as chlorine (Cl), fluorine (F), bromine (Br), iodine (I), or the like. The halosilane source may also refer to a kind of halide. The term of "source" is used in the following cases in this specification, meaning "a liquid source in a liquid state", meaning "a source gas in a gaseous state", or meaning the both cases thereof.

For example, a source gas containing Si and Cl, i.e., a chlorosilane source gas can be used as the halosilane source gas. Hexachlorodisilane ($Si_2Cl_6$, abbreviation: HCDS) gas can be used as the chlorosilane source gas. When a liquid source in a liquid state under normal temperature and pressure such as HCDS is used, the liquid source is vaporized by a vaporization system such as a vaporizer or a bubbler, and then supplied as a source gas (HCDS gas).

An oxygen (O)-containing gas, for example, is supplied as a reaction gas from the gas supply pipe 232b into the process chamber 201 via the MFC 241b, the valve 243b, and the nozzle 249b. The O-containing gas acts as oxidation gas, i.e., O-source in the film forming process described later. Oxygen ($O_2$) gas can be used as the O-containing gas, for example.

A hydrogen (H)-containing gas, for example, is supplied as reaction gas from the gas supply pipe 232c into the process chamber 201 via the MFC 241c, the valve 243c, the gas supply pipe 232a, and the nozzle 249a. The H-containing gas cannot perform an oxidation action alone. However, when the H-containing gas reacts with the O-containing gas under a specific condition, it generates oxidation species such as an atomic oxygen (O) to act to enhance an oxidation treatment efficiency in film forming process described later. Thus, the H-containing gas can be included in the oxidation gas as well as the O-containing gas. Hydrogen ($H_2$) gas can be used as the H-containing gas.

Hydrogen fluoride (HF) gas, for example, is supplied as a first cleaning gas from the gas supply pipe 232d into the process chamber 201 via the MFC 241d, the valve 243d, the gas supply pipe 232b, and the nozzle 249b.

HF gas, for example, is supplied as a second cleaning gas from the gas supply pipe 232e into the purging space 201a inside of the cover 209a via the MFC 241e, the valve 243e, and the nozzle 249e.

A first alcohol is supplied from the gas supply pipe 232i into the process chamber 201 via the MFC 241i, the valve 243i, the gas supply pipe 232b, and the nozzle 249b. The alcohol cannot perform a cleaning action alone. However, when it is added to the cleaning gas, it acts so as to enhance a cleaning treatment efficiency. Thus, the alcohol may be included in the cleaning gas as well as HF gas. Methanol ($CH_3OH$) can be used as the alcohol. When an alcohol in a liquid state under normal temperature and pressure such as $CH_3OH$ is used, the alcohol in a liquid state is vaporized by a vaporization system such as a vaporizer or a bubbler, and then supplied as the alcohol gas ($CH_3OH$ gas).

$CH_3OH$, for example, is supplied as a second alcohol from the gas supply pipe 232j into the purging space 201a inside of the cover 209a via the MFC 241j, the valve 243j, the gas supply pipe 232e, and the nozzle 249e.

Nitrogen ($N_2$) gas, for example, is supplied as the inert gas from the gas supply pipes 232f to 232h into the process chamber 201 via the MFCs 241f to 241h, the valves 243f to 243h, the gas supply pipes 232a, 232b, 232e, and the nozzles 249a, 249b, 249e, respectively.

When supplying the source gas from the gas supply pipe 232a, a source gas supply system is mainly constituted of the gas supply pipe 232a, the MFC 241a, and the valve 243a. The nozzle 249a may be included in the source gas supply system. The source gas supply system may be called a source supply system. When supplying a halosilane source gas from the gas supply pipe 232a, the source gas supply system may be called a halosilane source gas supply system, or a halosilane source supply system.

When supplying the O-containing gas from the gas supply pipe 232b, an O-containing gas supply system is mainly constituted of the gas supply pipe 232b, the MFC 241b, and the valve 243b. The nozzle 249a may be included in the O-containing gas supply system. The O-containing gas supply system may be called an oxidation gas supply system or an oxidant supply system.

When supplying the H-containing gas from the gas supply pipe 232c, a H-containing gas supply system is mainly constituted of the gas supply pipe 232c, the MFC 241c, and the valve 243c. The downstream side of the connection portion between the gas supply pipe 232a and the gas supply pipe 232c of the gas supply pipe 232a, and the nozzle 249a, may be included in the H-containing gas supply system. The H-containing gas supply system may be included in the abovementioned oxidation gas supply system (the oxidant supply system).

When supplying the cleaning gas from the gas supply pipe 232d, a first cleaning gas supply system is mainly constituted of the gas supply pipe 232d, the MFC 241d, and the valve 243d. The downstream side of the connection portion between the gas supply pipe 232b and the gas supply pipe 232d of the gas supply pipe 232b, and the nozzle 249b, may be included in the first cleaning gas supply system. When supplying HF gas from the gas supply pipe 232d, the first cleaning gas supply system may be called a first HF gas supply system.

When supplying the cleaning gas from the gas supply pipe 232e, a second cleaning gas supply system is mainly constituted of the gas supply pipe 232e, the MFC 241e, and the valve 243e. The nozzle 249e may be included in the second cleaning gas supply system. When supplying the HF gas from the gas supply pipe 232e, the second cleaning gas supply system may be called a second HF gas supply system.

When supplying the alcohol from the gas supply pipe 232i, a first alcohol supply system is mainly constituted of the gas supply pipe 232i, the MFC 241i and the valve 243i. The downstream side of the connection portion between the gas supply pipe 232b and the gas supply pipe 232i of the gas supply pipe 232b, and the nozzle 249b, may be included in the first alcohol supply system. The first alcohol supply system may be included in the first cleaning gas supply system.

When supplying the alcohol from the gas supply pipe 232j, a second alcohol supply system is mainly constituted of the gas supply pipe 232j, the MFC 241j, and the valve 243j. The downstream side of the connection portion between the gas supply pipe 232e and the gas supply pipe 232j of the gas supply pipe 232e, and the nozzle 249e, may be included in the second alcohol supply system. The second alcohol supply system may be included in the second cleaning gas supply system.

One or either or all of the abovementioned source gas supply system, the O-containing gas supply system, and the H-containing gas supply system may also be called a film forming gas supply system. One or both of the O-containing gas supply system and the H-containing gas supply system may also be called a reaction gas supply system.

One or both of the abovementioned first cleaning gas supply system and the second cleaning gas supply system may also be called a cleaning gas supply system. One or both of the abovementioned first HF gas supply system and the second HF gas supply system may also be called a HF gas supply system.

One or both of the abovementioned first alcohol supply system and the second alcohol supply system may also be called an alcohol supply system. The alcohol supply system may be included in the cleaning gas supply system.

In addition, an inert gas supply system is mainly constituted of the gas supply pipes 232f to 232h, the MFCs 241f to 241h and the valves 243f to 243h. The inert gas supply system can be also called a purge gas supply system, a diluent gas supply system or a carrier gas supply system.

The exhaust pipe 231 for exhausting an atmosphere in the process chamber 201 is installed to the reaction tube 203. A vacuum pump 246 as a vacuum exhaust device is connected to the exhaust pipe 231 via a pressure sensor 245, which is a pressure detector (pressure detecting part) for detecting an pressure in the process chamber 201, and an APC (Auto Pressure Controller) valve 244, which is an exhaust valve (pressure adjusting part). The APC valve 244 is configured to start/stop vacuum exhaust in the process chamber 201 by opening/closing a valve in a state of being operated the vacuum pump 246, and further to adjust the pressure in the process chamber 201 by adjusting an opening degree of the valve based on pressure information detected by the pressure sensor 245 in a state of being operated the vacuum pump 246. An exhaust system is mainly constituted of the exhaust pipe 231, the APC valve 244, and the pressure sensor 245. The vacuum pump 246 may also be included in the exhaust system. The exhaust pipe 231 is not limited to be installed to the reaction tube 203 but may be installed to the manifold 209, similarly to the nozzles 249a, 249b and 249e.

A seal cap 219 is provided below the manifold 209 as a furnace throat lid member capable of air-tightly sealing a lower end opening of the manifold 209. The seal cap 219 is configured to be in contact with the lower end of the manifold 209 from the lower side of the manifold 209 in the vertical direction. The seal cap 219 is made of, for example, a metal such as SUS, and formed into a disc shape. An O-ring 220b as a seal member which is in contact with the lower end portion of the manifold 209, is installed on an upper surface of the seal cap 219. A rotary mechanism 267 for rotating the boat 217 described later, is installed on an opposite side to the process chamber 201 of the seal cap 219. A rotary shaft 255 of the rotary mechanism 267 is connected to the boat 217 so as to penetrate through the seal cap 219. The rotary mechanism 267 is configured to rotate the wafer 200 by rotating the boat 217. The seal cap 219 is configured to be vertically moved by a boat elevator 115 as an elevation mechanism which is vertically provided to the outside of the reaction tube 203. The boat elevator 115 is configured so that the boat 217 can be loaded into the process chamber 201 or unloaded from the process chamber 201 by elevating or lowering the seal cap 219. The boat elevator 115 is configured as a transfer device (transfer mechanism) for transferring the boat 217 and the wafer 200 supported on the boat 217 into and out of the process chamber 201.

The boat 217 as a substrate support, is configured so as to arrange the plurality of e.g., 25 to 200 wafers 200, in a horizontal posture vertically with centers thereof aligned with each other, and so as to be supported in multiple stages, namely, so as to be arranged with a space therebetween. The boat 217 is made of, for example, a heat resistant material such as quartz or SiC. Heat insulating plates 218 made of, for example, a heat resistant material such as quartz or SiC, are supported in a lower part of the boat 217 in a horizontal posture in multiple stages. With this configuration, heat from the heater 207 is hardly transmitted toward the seal cap 219. However, this embodiment is not limited thereto. Instead of installing the heat insulating plates 218 in the lower portion of the boat 217, a heat insulating tube configured as a tubular member and made of a heat resistant material such as quartz or SiC, may be installed.

A temperature sensor 263 as a temperature detector is installed in the reaction tube 203. A degree of energization to the heater 207 is adjusted based on temperature information detected by the temperature sensor 263, so that a temperature in the process chamber 201 becomes a desired temperature distribution. The temperature sensor 263 is configured of an L-shaped configuration, similarly to the nozzles 249a and 249b, and is installed along the inner wall of the reaction tube 203.

Figure 3:
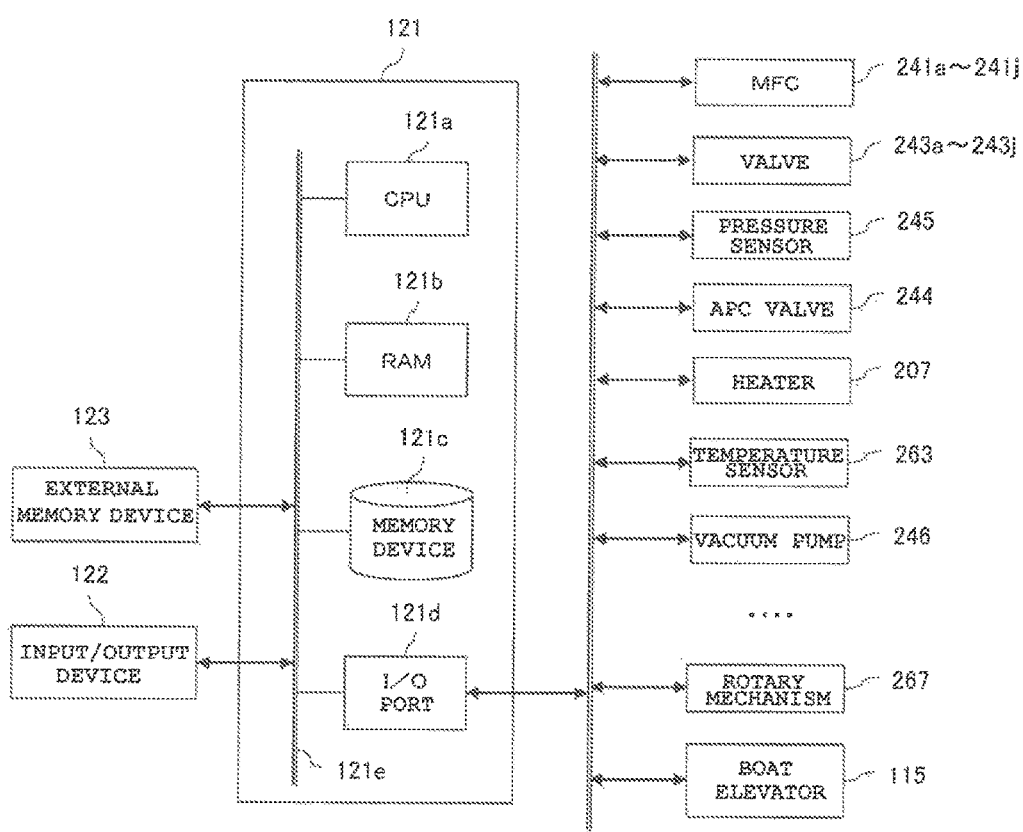
FIG. 3 is a schematic view illustrating a configuration of a controller of the substrate processing apparatus suitably used in the embodiment of the present disclosure, a control system of the controller being shown in a block diagram.

As shown in FIG. 3, a controller 121 which is a control unit (control means) is configured as a computer including CPU (Central Processing Unit) 121a, RAM (Random Access Memory) 121b, a memory device 121c, and I/O port 121d. The RAM 121b, the memory device 121c and the I/O port 121d are configured so that data exchange with the CPU 121a can be carried out via an internal bus 121e. An input/output device 122 configured as a touch panel, etc., for example, is connected to the controller 121.

The memory device 121c is configured of a flash memory, HDD (Hard Disc Drive), or the like, for example. A control program for controlling operations the substrate processing apparatus, a process recipe in which a sequence or condition, etc., for a substrate processing described later is written, or a cleaning recipe in which a sequence or condition, etc., for a cleaning processing described later is written, are readably stored in the memory device 121c. Each of the process recipe and the cleaning recipe, is a combination of sequences so that each sequence in various process (film forming process or cleaning process) described later executed by the controller 121, and a predetermined result can be obtained, thereby functioning as a program. Hereafter, the process recipe, the cleaning recipe, and the control program, etc., are generally and simply called a program. Further, the process recipe and the cleaning recipe are simply called a recipe. The term of the program is used in the following cases in this specification, meaning the recipe alone, or meaning the control program alone, or meaning the both case thereof. The RAM 121b is configured as a memory area (work area) in which the program or data, etc., read by the CPU 121a is temporarily stored.

The I/O port 121d is connected to the abovementioned MFCs 241a to 241j, the valves 243a to 243j, the pressure sensor 245, the APC valve 244, the vacuum pump 246, the heater 207, the temperature sensor 263, the rotary mechanism 267, the boat elevator 115, etc.

The CPU 121a is configured to read and execute the control program from the memory device 121c, and read the process recipe from the memory device 121c according to input of an operation command from the input/output device 122, etc. The CPU 121a is configured to control a flow rate adjusting operation of various gases by the MFCs 241a to 241j, the opening/closing operation of the valves 243a to 243j, the opening/closing operation of the APC valve 244, the pressure adjusting operation by the APC valve 244 based on the pressure sensor 245, start and stop of the vacuum pump 246, the temperature adjusting operation of the heater 207 based on the temperature sensor 263, a rotation and rotation speed adjusting operation of the boat 217 by the rotary mechanism 267, the elevating operation of the boat 217 by the boat elevator 115, and the like, according to contents of the read process recipe.

The controller 121 may be configured by installing on the computer the abovementioned program stored in an external memory device 123 (for example, a magnetic tape, a magnetic disc such as a flexible disc or a hard disc, an optical disc such as CD or DVD, a magneto-optical disc such as MO, a semiconductor memory such as a USB memory or a memory card). The memory device 121c or the external memory device 123 is configured as a non-transitory computer-readable recording medium. Hereinafter, these means for supplying the program will be simply referred to as "a recording medium". When the term "recording medium" is used herein, it may include a case in which only the memory device 121c is included, a case in which only the external memory device 123 is included, or a case in which both the memory device 121c and the external memory device 123 are included. The program can be supplied to the computer not through the external memory device 123, using a communication means such as Internet or dedicate lines, etc.

(2) Film Forming Process

An example of a sequence of forming a film on a substrate, which is one of the processes for manufacturing a semiconductor device using the abovementioned substrate processing apparatus, will be described with reference to FIG. 4. In the following description, an operation of each part constituting the substrate processing apparatus is controlled by the controller 121.

Figure 4:
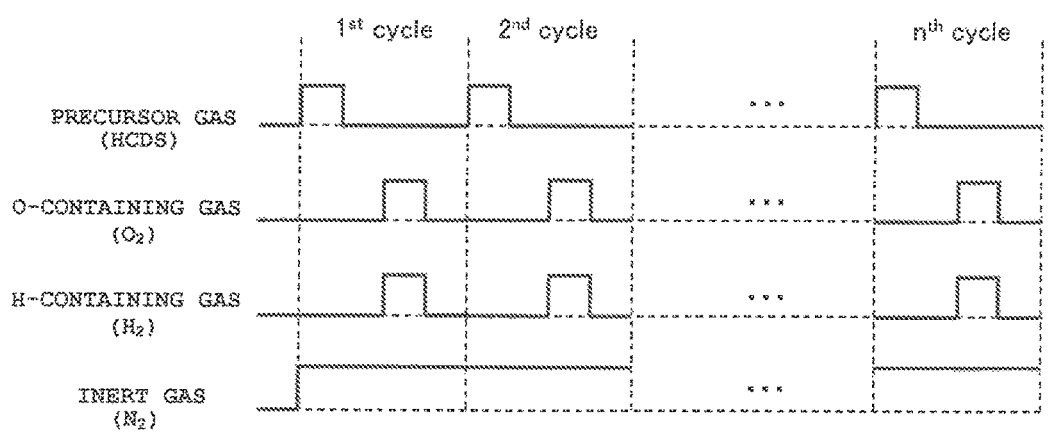
FIG. 4 is a view illustrating gas supply timings in a film forming sequence according to one embodiment of the present disclosure.

In the film forming sequence shown in FIG. 4, a silicon oxide film ($SiO_2$ film, simply called SiO film hereafter) as an O-containing film, is formed on the wafer 200 by performing a cycle a predetermined number of times (n times or more), the cycle including performing the following steps 1 and 2 non-simultaneously, namely, without synchronization:

step 1 of supplying HCDS gas as a source gas to wafer 200 as a substrate housed in the process container (the process chamber 201); and step 2 of supplying $O_2$ gas as an O-containing gas and $H_2$ gas as a H-containing gas into the heated process container under a pressure less than an atmospheric pressure.

In this specification, abovementioned film forming process is also shown as follows for convenience. The same notation is also used in the following explanations of modified examples and other embodiments.

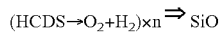

$(HCDS \rightarrow O_2+H_2) \times n \Rightarrow SiO$

The term of "wafer" is used in the following cases in this specification, meaning "wafer itself", and meaning "laminate (assembly) of wafer, and a prescribed layer or film, etc., formed on a surface of the wafer". Namely, a prescribed layer or film, etc., formed on the surface of the wafer is also called a wafer. The term of "surface of wafer" is used in the following cases in this specification, meaning "a surface (an exposed surface) of a wafer itself", or meaning "a surface of a prescribed layer or film, etc., formed on the wafer, i.e., an outermost surface of the wafer as a laminate".

Therefore, the description of "supplying a prescribed gas to a wafer" is used in the following cases in this specification, meaning "a prescribed gas is directly supplied to a surface (an exposed surface) of a wafer itself", or meaning "a prescribed gas is supplied to a layer or film, etc., formed on the wafer, i.e., to an outermost surface of the wafer as a laminate". Further, the description of "a prescribed layer (or film) is formed on a wafer" is used in the following cases in this specification, meaning "a prescribed layer (or film) is directly formed on a surface (an exposed surface) of a wafer itself", or meaning "a prescribed layer (or film) is formed on a prescribed layer or film, etc., formed on a wafer, i.e., on an outermost surface of a wafer as a laminate".

Further, a case that the term of "substrate" is used in this specification, is similar to a case that the term of "wafer" is used. In this case, the term of "wafer" may be replaced with the term of "substrate" in the abovementioned explanation.

(Wafer Charging and Boat Loading)

A plurality of wafers 200 are charged on the boat 217 (wafer charging). Thereafter, the boat 217 supporting the plurality of wafers 200 is lifted up by the boat elevator 115 and loaded into the process chamber 201 (boat loading) as shown in FIG. 1. In this state, the lower end portion of the manifold 209 is in a sealed state by the seal cap 219 via the O-ring 220b.

(Pressure Adjusting and Temperature Adjusting)

The interior of the process chamber 201, i.e., a space in which the wafer 200 exists, is evacuated (or depressurized) by the vacuum pump 246 so as to reach a desired pressure (vacuum degree). At this time, the pressure in the process chamber 201 is measured by the pressure sensor 245, and the APC valve 244 is feedback-controlled based on the measured pressure information. The vacuum pump 246 is always kept in an operative state at least until a process to the wafer 200 is terminated. Further, the wafer 200 accommodated in the process chamber 201 is heated by the heater 207 to a desired temperature. At this time, a degree of energization to the heater 207 is feedback-controlled based on the temperature information detected by the temperature sensor 263 so that a temperature in the process chamber 201 becomes a desired temperature distribution. Such heating the interior of the process chamber 201 by the heater 207 is continuously performed at least until a process on the wafer 200 is terminated. Further, rotation of the boat 217 and wafer 200 is started by the rotary mechanism 267. The rotation of the boat 217 and wafer 200 by the rotary mechanism 267 is continuously performed at least until a process on the wafer 200 is terminated.

(SiO Film Forming Process)

Thereafter, the following steps 1 and 2 are sequentially executed.

[Step 1]

(Supply of HCDS Gas)

In this step, HCDS gas is supplied to the wafer 200 in the process chamber 201.

The valve 243a is opened to flow HCDS gas into the gas supply pipe 232a. A flow rate of HCDS gas is controlled by the MFC 241a, and HCDS gas is supplied via the nozzle 249a into the process chamber 201 and is exhausted through the exhaust pipe 231. At this time, HCDS gas is supplied to the wafer 200. At this time, the valve 243f is simultaneously opened to flow $N_2$ gas into the gas supply pipe 232f. A flow rate of $N_2$ gas is controlled by the MFC 241f, and $N_2$ gas is supplied into the process chamber 201 together with HCDS gas and is exhausted through the exhaust pipe 231.

Further, in order to prevent HCDS gas into the nozzles 249a and a purging space 201a inside of the cover 209a from invading, the valves 243g and 243h are opened to flow $N_2$ gas into the gas supply pipes 232g and 232h. $N_2$ gas is supplied into the process chamber 201 via the gas supply pipes 232b and 232e, the nozzles 249a and 249e, and the purging space 201a, and is exhausted through the exhaust pipe 231.

At this time, the APC valve 244 is appropriately controlled so that the pressure in the process chamber 201 is set to a pressure within range of, e.g., 1 to 4000 Pa, preferably 67 to 2666 Pa, and more preferably 133 to 1333 Pa.

A supply flow rate of HCDS gas controlled by the MFC 241a so that the flow rate is set to a flow rate within range of, e.g., 1 to 2000 sccm, and preferably 10 to 1000 sccm. A supply flow rate of $N_2$ gas controlled by the MFCs 241f to 241h so that the flow rate is set to a flow rate within range of, e.g., 100 to 10000 sccm, respectively. A time duration for which HCDS gas is supplied to the wafer 200, i.e., a gas supply time (exposure time), is set to a time within range of, e.g., 1 to 120 seconds, and preferably 1 to 60 seconds.

The temperature of the heater 207 is set a temperature so that a temperature of the wafer 200 become within range of, e.g., 250 to 700 degrees C., preferably 300 to 650 degrees C., and more preferably 350 to 600 degrees C.

When the temperature of the wafer 200 is lower than 250 degrees C., HCDS is hardly chemically adsorbed on the wafer 200, and a practical film formation rate cannot be obtained. This can be solved when the temperature of the wafer 200 is set to 250 degrees C. or more. When the temperature of the wafer 200 is set to 300 degrees C. or more, and further 350 degrees C. or more, HCDS can be more sufficiently adsorbed on the wafer 200, and a more sufficient film formation rate can be obtained.

When the temperature of the wafer 200 exceeds 700 degrees C., a CVD reaction is too much strengthened (excessive gas-phase reaction is occurred), so that the film thickness uniformity easily deteriorates and it is difficult to control the uniformity. When the temperature of the wafer 200 is set to 700 degrees C. or less, the deterioration of film thickness uniformity can be suppressed and the control of the uniformity can be available by appropriately controlling the gas-phase reaction. In particular, when the temperature of the wafer 200 is set to 650 degrees C. or less, and further 600 degrees C. or less, and thereby a surface reaction is more predominant than vapor phase reaction, the film thickness uniformity can be easily secured, and its control becomes easy.

Accordingly, the temperature of the wafer 200 is set to a temperature within range of 250 to 700 degrees C., preferably 300 to 650 degrees C., and more preferably 350 to 600 degrees C.

Under the foregoing conditions, HCDS gas is supplied to the wafer 200 to form a Si-containing layer which contains Cl and has a thickness ranging, e.g., from less than one atomic layer to several atomic layers, on the outermost surface of the wafer 200 as a first layer. The Si-containing layer containing Cl may include either or both of a silicon layer containing Cl and an adsorption layer of HCDS gas. The adsorption layer of HCDS gas may include either or both of a chemical adsorption layer and a physical adsorption layer.

Here, a layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing Cl may include both of the Cl-containing Si layer and the adsorption layer of HCDS gas. However, as described above, the Si-containing layer containing Cl will be represented by the expression of "one atomic layer", "several atomic layers", or the like.

Under a condition in which HCDS gas is self-decomposed (pyrolyzed), i.e., under a condition in which a thermal decomposition reaction of HCDS gas occurs, Si is deposited on the wafer 200 to form a Cl-containing Si layer. Under a condition in which HCDS gas is not self-decomposed (not pyrolyzed), i.e., under a condition in which a thermal decomposition reaction of HCDS gas does not occur, HCDS gas is adsorbed onto the wafer 200 to form the adsorption layer of HCDS gas. In some embodiment, forming the Cl-containing Si layer on the wafer 200 is more desirable than forming the adsorption layer of HCDS gas on the wafer 200, in order to secure a higher film forming rate. The Cl-containing Si layer is also referred to as a Si-containing layer hereafter as a matter of convenience.

When the thickness of the first layer exceeds several atomic layers, an effect of a modification reaction in Step 2 described later does not reach the entire first layer. In addition, a minimum value of the thickness of the first layer is less than one atomic layer. Accordingly, the thickness of the first layer preferably ranges from less than one atomic layer to several atomic layers. When the thickness of the first layer is one atomic layer or less, i.e., one atomic layer or less than one atomic layer, an effect of the modification reaction in Step 2 described later can be relatively increased, and a time required for the modification reaction in Step 2 can be reduced. A time required for forming the first layer in Step 1 can also be reduced. As a result, a processing time per one cycle can be reduced, and a total processing time can also be reduced. Namely, the film forming rate can be increased. In addition, when the thickness of the first layer is one atomic layer or less, the film thickness uniformity can easily be controlled.

(Residual Gas Removal)

After the first layer is formed, the valve 243a is closed to stop the supply of HCDS gas. At this time, while the APC valve 244 is kept opened, the interior of the process chamber 201 is evacuated by the vacuum pump 246, and the residual gas remaining in the process chamber 201 such as an unreacted HCDS gas or a HCDS gas remaining after forming the first layer, is removed out of the process chamber 201. At this time, while the valves 243f to 243h are kept opened, the supply of $N_2$ gas into the process chamber 201 is maintained. $N_2$ gas acts as a purge gas, and thus, the residual gas remaining in the process chamber 201 can be effectively removed from the process chamber 201.

At this time, the residual gas remaining in the process chamber 201 may not completely be removed, and the interior of the process chamber 201 may not completely be purged. When the residual gas remaining in the process chamber 201 is very small in amount, there may be no harmful effect on the subsequent Step 2. Here, a flow rate of $N_2$ gas supplied into the process chamber 201 need not to be high, and for example, by supplying an approximately the same amount as the volume of the reaction tube 203 (the process chamber 201) into the process chamber 201, the purging process can be performed without causing a harmful effect on Step 2. In this way, since the interior of the process chamber 201 is not completely purged, the purge time can be reduced and the throughput can be improved. In addition, the consumption of $N_2$ gas can be restricted to a required minimal amount.

Examples of the source gas may include an inorganic source gas such as dichlorosilane ($SiH_2Cl_2$, abbreviation DCS) gas, monochlorosilane ($SiH_3Cl$, abbreviation: MCS) gas, tetrachlorosilane, i.e., silicon tetrachloride ($SiCl_4$, abbreviation: STC) gas, trichlorosilane ($SiHCl_3$, abbreviation: TCS) gas, trisilane ($Si_3H_8$, abbreviation: TS) gas, disilane ($Si_2H_6$, abbreviation: DS) gas, monosilane ($SiH_4$, abbreviation: MS) gas, or the like, and an organic source gas such as tetrakis(dimethylamino)silane ($Si[N(CH_3)_2]_4$, abbreviation: 4DMAS) gas, tris(dimethylamino)silane ($Si[N(CH_3)_2]_3H$, abbreviation: 3DMAS) gas, bis(diethylamino) silane ($Si[N(C_2H_8)_2]_2H_2$, abbreviation: BDEAS) gas, bis(tertiary-butylamino)silane ($SiH_2[NH(C_4H_9)]_2$, abbreviation: BTBAS) gas, or the like, in addition to HCDS gas.

Examples of the inert gas may include rare gases such as Ar gas, He gas, Ne gas, Xe gas, and the like, in addition to $N_2$ gas.

[Step 2]
(Supply of $O_2$ Gas and $H_2$ Gas)

After Step 1 is terminated, $O_2$ gas and $H_2$ gas are separately supplied into the process chamber 201, and mixed and reacted in the process chamber 201.

In this step, opening/closing of the valves 243b, 243f to 243h are controlled in the same manner as opening/closing of the valves 243a, 243f to 243h are controlled in Step 1. $O_2$ gas is flown from the gas supply pipe 232b and supplied into the process chamber 201 via nozzle 249b, with the flow rate adjusted by MFC 241b. At this time, the valve 243c is simultaneously opened. $H_2$ gas is flown from the gas supply pipe 232c and supplied into the process chamber 201 via the gas supply pipe 232a and the nozzle 249a, with the flow rate adjusted by MFC 241c. $O_2$ gas and $H_2$ gas are mixed and reacted for the first time in the process chamber 201, and thereafter $O_2$ gas and $H_2$ gas are exhausted through the exhaust pipe 231.

At this time, the APC valve 244 is appropriately controlled so that the pressure in the process chamber 201 is set to a pressure less than an atmospheric pressure, e.g., within range of 1 to 1333 Pa.

A supply flow rate of $O_2$ gas controlled by the MFC 241b is set to a flow rate within range of, e.g., 1000 to 10000 sccm. A supply flow rate of $H_2$ gas controlled by the MFC 241c is set to a flow rate within range of, e.g., 1000 to 10000 sccm. A time duration for supplying $O_2$ gas and $H_2$ gas to the wafer 200, i.e., a gas supply time (irradiation time), is set to a time within range of, e.g., 1 to 120 seconds.

Other process conditions are the same as those of Step 1.

By suppling $O_2$ gas and $H_2$ gas into the process chamber 201 under the foregoing conditions, $O_2$ gas and $H_2$ gas are thermally activated (excited) by non-plasma and reacted under heated decompression atmosphere, and thereby water-content ($H_2O$)-free oxidation species containing oxygen such as an atomic oxygen (O), is generated. Then, an oxidation treatment is performed to the first layer (Si-containing layer) formed on the wafer 200 in step 1, mainly by the oxidation species. Since an energy possessed by this oxidation species is higher than a bonding energy of Si—Cl, Si—H and the like included in the Si-containing layer, Si—Cl bond, Si—H bond and the like contained in the Si-containing layer are separated, by giving the energy of this oxidation species to the Si-containing layer. H, Cl and the like which are separated from the bond with Si, are removed from the film, and are discharged as $Cl_2$, HCl, etc. Further, a dangling bond of Si as a result of separation of the bonds from H and Cl, is bonded to O contained in the oxidation species, and thereby forming a Si—O bond. Thus, the Si-containing layer is changed (reformed) to the second layer, i.e., the SiO layer having small content of impurities such as Cl. With this oxidation process, an oxidation power can be significantly enhanced compared to supplying $O_2$ gas alone or supplying the water vapor ($H_2O$). Namely, by adding $H_2$ gas to $O_2$ gas under reduced-pressure atmosphere, an effect of significantly enhanced oxidation power can be obtained compared to supplying $O_2$ gas alone or supplying $H_2O$ gas.

(Residual Gas Removal)

After the first layer (Si-containing layer) is changed to the second layer (SiO layer), the valves 232b and 232c are closed to stop the supply of $O_2$ gas and $H_2$ gas. Then, the residual gas remaining in the process chamber 201 such as $O_2$ gas, $H_2$ gas, or reaction by-products are removed from the process chamber 201 by performing the processing procedure and the process condition similar to the processing procedure and the process condition of step 1. At this time, as in step 1, the residual gas remaining in the process chamber 201 may not completely be removed.

Examples of the O-containing gas may include ozone ($O_3$) gas, etc., in addition to $O_2$ gas. Examples of the H-containing gas may include deuterium ($D_2$) gas and etc., in addition to $H_2$ gas. When an aminosilane gas such as 4DMAS gas, 3DMAS gas, etc. is used as the source gas, $O_3$ gas may be used as O-containing gas so as to form a film with sufficient film formation rate (a similar rate of using H-containing gas) without using the H-containing gas. As the inert gas, various rare gas exemplified in step 1 may be used in addition to $N_2$ gas, for example.

(Performing Predetermined Number of Times)

By performing a cycle a predetermined times (n times), the cycle including non-simultaneously performing abovementioned steps 1 and 2, i.e., the cycle including performing abovementioned steps 1 and 2 without synchronization, the SiO film having a predetermined film thickness can be formed on the wafer 200. The abovementioned cycle is preferably repeated multiple times. Namely, a thickness of the second layer (SiO layer) formed when the abovementioned cycle is performed once, is set to be smaller than a desired film thickness, and it is preferable to repeat the abovementioned cycle multiple number of times until the film thickness of the SiO film formed by laminating the second layer (SiO layer) reaches a desired thickness.

(Purging and Returning to Atmospheric Pressure)

After the formation of the SiO film is terminated, the valves 243f to 243h are opened to supply $N_2$ gas respectively from the gas supply pipes 232f to 232h into the process chamber 201, and $N_2$ gas is exhausted through the exhaust pipe 231. $N_2$ gas acts as a purge gas. In this way, the interior of the process chamber 201 is purged with the inert gas and the residual gas remaining in the process chamber 201 and reaction by-products are removed from the process chamber 201 (purge). Thereafter, an atmosphere in the process chamber 201 is substituted with the inert gas (inert gas substitution), and the pressure in the process chamber 201 returns to normal pressure (return to atmospheric pressure).

(Boat Unloading and Wafer Discharging)

The seal cap 219 is descended by the boat elevator 115 to open the lower end of the manifold 209. The processed wafers 200 are unloaded to the outside of the reaction tube 203 through the lower end of the manifold 209, being supported by the boat 217 (boat unloading). Then, the processed wafers 200 are discharged from the boat 217 (wafer discharging).

(3) Cleaning Process

When the abovementioned film forming process is performed, deposits such as a thin film including the SiO film are accumulated on the inner wall of the reaction tube 203, the surfaces of the nozzles 249a and 249b, the surface of the cover 209a, the surface of the boat 217, an upper surface of the seal cap 219 and so on. Namely, this deposits including O are adhered and accumulated on the surface of the member in the process chamber 201 heated. In addition, in some embodiment, even the interior of the purging space 201a is purged by $N_2$ gas during the film forming process, a small amount of HCDS gas, $O_2$ gas, and $H_2$ gas are invaded in the purging space 201a. Thus, in some embodiment, deposits including O is accumulated to the surface of the members of the interior of the purging space 201a such as the inner wall of the manifold 209, the surface of the inner of the cover 209a and so on. A cleaning process is performed before an amount of these deposits (thickness of the deposits), i.e., accumulated film thickness, reaches a predetermined amount (thickness) which is a value before the deposits start separation or dropping.

Figure 5:
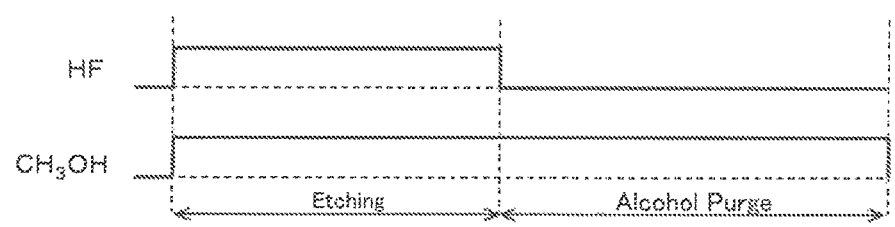
FIG. 5 is a view illustrating gas supply timings in a cleaning sequence according to one embodiment of the present disclosure.

The cleaning process shown in FIG. 5 includes:

supplying at least HF gas into the process container (the process chamber 201) (etching step);

supplying an alcohol into the process container in a state where supply of HF gas into the process container is stopped (alcohol purge step), wherein the etching step and the alcohol purge step are continuously performed without providing an intermittent period therebetween.

Hereinafter, one example of the cleaning process in the present embodiment will be described with reference to FIG. 5. In the following description, operations of various parts constituting the substrate processing apparatus are controlled by the controller 121.

(Boat Loading)

An empty boat 217 with no wafer 200 loaded therein is lifted by the boat elevator 115 to be transferred into the process chamber 201. In this state, the lower end portion of the manifold 209 is in a sealed state by the seal cap 219 via the O-ring 220b.

(Pressure Adjustment and Temperature Adjustment)

The interior of the process chamber 201 is vacuum-exhausted by the vacuum pump 246 to a predetermined etching pressure described later. The vacuum pump 246 is maintained continuously in an operating state until at least the alcohol purge step described later is terminated. Further, the interior of the process chamber 201 is heated as necessary by the heater 207 to a predetermined etching temperature described later. Furthermore, in some embodiment, the etching step and the alcohol purge step are performed at room temperature or lower than the room temperature described later. Thus, in some embodiment, a power is not supplied to the heater 207. Also, the boat 217 begins to be rotated by the rotary mechanism 267. The boat 217 is continuously rotated by the rotary mechanism 267 until the alcohol purge step described later is terminated. However, the boat 217 may not be rotated.

(Etching Step)

In this step, HF gas is at least supplied into the process chamber 201 after having performed the process of forming the SiO film on the wafer 200, i.e., into the process chamber 201 with deposits including O-containing film adhered thereon.

The valves 243d and 243e are opened to flow HF gas into the gas supply pipes 232d and 232e respectively. A flow rate of HF gas is controlled by the MFCs 241d and 241e, and HF gas is supplied via the gas supply pipe 232b, the nozzles 249a and 249e, and the purging space 201a into the process chamber 201. At this time, in some embodiment, the valves 243i and 243j are opened simultaneously to flow $CH_3OH$ ($CH_3OH$ gas) into the gas supply pipes 232b and 232e respectively. FIG. 5 is an example illustrating $CH_3OH$ gas flown together with HF gas. A flow rate of $CH_3OH$ is controlled by the MFCs 241i and 241j, and $CH_3OH$ gas is supplied via the nozzles 249a and 249e into the process chamber 201. At this time, $N_2$ gas may be flown from the gas supply pipes 232g and 232h to dilute HF gas and $CH_3OH$ in the gas supply pipes 232b and 232e, respectively. By controlling a supply flow rate of $N_2$ gas, concentrations of HF gas and $CH_3OH$ supplied into the process chamber 201 can be controlled. Further, in order to prevent HF gas into the nozzle 249a from invading the valve 243f is opened to flow $N_2$ gas into the gas supply pipe 232f. $N_2$ gas is supplied via the gas supply pipe 232a and the nozzle 249a into the process chamber 201, and is exhausted through the exhaust pipe 231.

HF gas supplied into the process chamber 201 contacts with the surface of the members in the process chamber 201 such as the inner wall of the reaction tube 203, the surface of the nozzle 249a and 249b, the surface of boat 217, an inner and outer surface of the cover 209a, the inner wall of the manifold 209 and an upper surface of the seal cap 219, when HF gas passes through the interior of the process chamber 201, and is exhausted through the exhaust pipe 231. At this time, deposits including oxygen-containing film adhered to the members in the process chamber 201 are removed by a thermochemical reaction. Namely, the deposits are removed by the etching reaction by the HF and the deposits. Further, when the etching reaction is in progress, a water content ($H_2O$) is generated in the process chamber 201 by combining O included in the deposits (SiO) with H included in the HF. Further, when the etching reaction is in progress, $SiF_4$, or the like, is generated in the process chamber 201 by combining O included in the deposits (SiO) with H included in the HF.

In this way, by supplying HF gas into the process chamber 201 in which deposits including O-containing film are adhered, it is possible to progress the etching reaction of the abovementioned deposits under a non-plasma atmosphere. Under these circumstances, by supplying $CH_3OH$ together with HF gas into the process chamber 201, it is possible to accelerate the abovementioned etching reaction by the HF. This is because, $CH_3OH$ supplied from the gas supply pipes 232i and 232j is mixed with the HF and reacted in the gas supply pipes 232i and 232j, the interior of the process chamber 201 and the purging space 201a. Then, an ionization of HF is accelerated due to an action of hydroxyl-group (—OH) included in $CH_3OH$, and active etching species such as $HF_2^-$ is generated. With this action of the etching species, as compare to a case of supplying HF gas alone into the process chamber 201, it is possible to accelerate the abovementioned etching reaction, increase an etching rate of deposits, and enhance the cleaning action. As a result, even when process conditions for progressing the etching process such as the temperature and the pressure in the process chamber 201, are set to relatively low temperature and low pressure respectively, higher etching rate can be obtained compared with a case of supplying HF gas alone into the process chamber 201.

In the etching step, supply flow rates of HF gas controlled by the MFCs 241d and 241e respectively are set to flow rates within range of, e.g., 1000 to 8000 sccm, and preferably 2000 to 8000 sccm. Supply flow rates of $CH_3OH$ controlled by the MFCs 241i and 241j respectively are set to flow rates within range of, e.g., 0 to 4000 sccm, and preferably 1000 to 4000 sccm. Namely, a flow rate ratio of a $CH_3OH$ flow rate to a HF gas flow rate ($CH_3OH$ flow rate/HF flow rate) is set to a ratio within range of 0 to 50%.

In addition, the APC valve 244 is appropriately controlled so that the pressure in the process chamber 201 is set to a pressure (etching pressure) within range of, e.g., 133 to 53329 Pa (1 to 400 Torr), preferably 667 to 39997 Pa (5 to 300 Torr), and more preferably 133 to 1333 Pa.

Further, the temperature of the heater 207 is set so that a temperature (etching temperature) in the process chamber 201 becomes within range of, e.g., 0 to 100 degrees C., preferably room temperature (25 degrees C.) to 50 degrees C., and more preferably 30 to 50 degrees C.

To set a temperature in the process chamber 201 lower than 0 degrees C., a large-scale cooling mechanism is required to be installed so as to lower the temperature in the process chamber 201 to this temperature, and it may cause the increase of substrate manufacturing cost and complicatedness of a temperature control. By setting the temperature in the process chamber 201 to 0 degrees C. or more, this problem can be solved. By setting the temperature in the process chamber 201 to room temperature or more, preferably 30 degrees C. or more, even a simple cooling mechanism such as a blower for cooling the process chamber 201, is not required to be installed. Thus, substrate manufacturing cost can be reduced and the temperature control can be simplified.

When the temperature in the process chamber 201 exceeds 100 degrees C., in some embodiment, the HF hardly adsorbed to the surface of the members in the process chamber 201, and it is difficult to perform the etching of deposits. By setting the temperature in the process chamber 201 to 100 degrees C. or less, this problem can be solved. By setting the temperature in the process chamber 201 to 50 degrees C. or less, the etching reaction by the HF can surely be progressed.

In this way, the etching step is performed under the condition as the water content remains in the process chamber 201, when a water content ($H_2O$) generated in the process chamber 201 exists alone in the process chamber 201, for example, under the temperature lower than the boiling point of this water content, or under the pressure as not to get this water content being boiled.

As the cleaning gas, a fluorine-based gas such as HF gas which includes H, is preferably used. This is because, the inventors of the present disclosure have found that in the etching step, when fluorine ($F_2$) gas or chlorine fluoride ($ClF_3$) gas is used as the replacement of HF gas into the process chamber 201, the abovementioned enhanced effects of the etching rate cannot be obtained even when the alcohol is added to these gases. A factor is considered that, though a fluorine-based gas such as HF gas which includes H, is required to be used as a cleaning gas for etching deposits mainly composed of SiO, i.e., deposits including O-containing film, $F_2$ gas and $ClF_3$ gas are a fluorine-based gas in which H is not included.

As the alcohol, a primary alcohol such as ethanol ($CH_3CH_2OH$), 1-propanol ($CH_3(CH_2)_2OH$), 1-butanol ($CH_3(CH_2)_3OH$), a secondary alcohol such as 2-propanol, i.e., isopropyl alcohol (($CH_3)_2CHOH$), 2-butanol ($CH_3CHOHCH_2CH_3$), and a tertiary alcohol such as t-butanol (($CH_3)_3(COH)$) are suitably used in addition to $CH_3OH$. Namely, by adding the substances having the hydroxyl group represented by a chemical formula; R—OH (R: $CH_3$, $C_2H_5$, $C_3H_7$, etc.) to the HF, abovementioned effect of increasing the etching action of the deposits can be obtained.

Examples of the inert gas may include respective rare gas exemplified in the abovementioned film forming process, in addition to $N_2$ gas.

(Alcohol Purge Step)

When performing the etching step, the water content and $SiF_4$ are generated in the process chamber 201 as described above. The water content generated in the process chamber 201 coexists with the HF remaining in the process chamber 201, and become a factor of corrosion of a metal member in the process chamber 201, thereby particles are generated. Thus, in the present embodiment, after the etching step is terminated, the alcohol purge step supplying $CH_3OH$ ($CH_3OH$ gas) into the process chamber 201, is performed in a state where supply of HF gas into the process chamber 201 is stopped.

In this step, the APC valve 244 is in an opened state, i.e., exhaust of the process chamber 201 is kept continuing, the valves 243d and 243e are closed and the supply of HF gas is stopped. In the etching step, when supplying $CH_3OH$ together with HF gas into the process chamber 201 in some embodiment, supply of $CH_3OH$ into the process chamber 201 is kept continuing without stopping while the supply of HF gas is stopped. Namely, the valves 243i and 243j are maintained open when the valves 243d and 243e are closed. In addition, in the etching step, when not supplying $CH_3OH$ into the process chamber 201 in some embodiment, the supply of $CH_3OH$ into the process chamber 201 is started simultaneously or beforehand with the stop of the supply of HF gas. Namely, the valves 243i and 243j are opened simultaneously or beforehand of the close of the valves 243d and 243e.

After the etching step is performed, when the HF and the water content coexist in the process chamber 201 during the exhaust of the process chamber 201, a vapor pressure of respective components is decreased and the water content may hardly be evaporated. Thus, when the etching step is terminated, the supply of HF gas into the process chamber 201 is suitably stopped immediately. By producing a state where the HF is not remained and the water content alone is remained in the process chamber 201, the water content can be removed from the interior of the process chamber 201 efficiently.

However, it is difficult to remove the water content from the interior of the process chamber 201 sufficiently and efficiently when the temperature in the process chamber 201 is maintained to the abovementioned etching temperature (0 to 100 degrees C.) without supplying $CH_3OH$ into the process chamber 201 while exhausting the interior of the process chamber 201. This is because, the abovementioned etching temperature is lower than the boiling point of water (100 degrees C.), and, the abovementioned etching temperature is a temperature at which the water content is easily remained in a state of liquid phase in the process chamber 201 when the water content exists alone in the process chamber 201, i.e., a temperature at which this water content is remained in the process chamber 201. Under this temperature, the water content is hardly evaporated alone and even a part of it is evaporated, the water content is easily remained in a liquid state in the process chamber 201. In addition, the water content have a characteristic of being easily remained in the low temperature part. It is difficult to remove the water content in this state even the process chamber 201 is vacuumed or purged by the inert gas such as $N_2$ gas, or even these are repeated. On the contrary, during the exhaust of the process chamber 201, the water content can be removed efficiently from the process chamber 201 by supplying $CH_3OH$ into the process chamber 201 even when the temperature in the process chamber 201 is maintained to the abovementioned temperature. Namely, the water content can be removed efficiently from the process chamber 201 by not heating the interior of the process chamber 201 at the temperature higher than the abovementioned temperature, i.e., the temperature at which the water content is not remained (e.g., a temperature higher than the boiling point of this water content), when the water content generated in the process chamber 201 exists alone.

As a factor of enhancing the efficiency of removing the water content by supplying $CH_3OH$ into the process chamber 201, a weakened intermolecular bonding (hydrogen bond) force of water molecules ($H_2O$) which are remained in the process chamber 201 due to an action of the hydroxyl group included in $CH_3OH$, can be given. This is because, when $CH_3OH$ is not supplied into the process chamber 201, the water content is easily adsorbed to the members in the process chamber 201 by occurring an interaction between the water molecules remained in the process chamber 201. On the other hand, when $CH_3OH$ is supplied into the process chamber 201, the water molecules remained in the process chamber 201 are surrounded by $CH_3OH$ molecules, and thereby the interaction between the water molecules is weakened. As a result, it is possible to discharge the water molecules remained in the process chamber 201 to the outside immediately. In addition, other factors are as follows. By the abovementioned hydroxyl group action, a bonding force of O—H bond included in each of the water molecules remained in the process chamber 201 is weakened, and thereby the water molecules are easily decomposed. By mixing $CH_3OH$ with the water content physically adsorbed to the surfaces of the members in the process chamber 201, the boiling point of the water content is decreased (a vapor pressure of the water content is increased), and thereby the water content is easily evaporated from the surfaces of these members (the water content physically adsorbed is easily separated). Namely, by supplying $CH_3OH$ into the process chamber 201, the water content remained in the process chamber 201 can be in an instable state, and thereby a removal of the water content from the process chamber 201 can be enhanced.

The alcohol purge step is performed continuously without providing an intermittent period between the etching step and the alcohol purge step. For example, after the etching step is performed, the alcohol purge step is performed without performing purge by the inert gas or vacuum to the interior of the process chamber 201, and also without supplying a water content, or the like, into the process chamber 201 from the outside thereof. Namely, the alcohol purge step is started immediately after the etching step, i.e., started almost simultaneously with termination of the etching step. With this configuration, gaseous water molecules remained in the process chamber 201 can be immediately surrounded by $CH_3OH$ molecules, and the interaction between the water molecules can be decreased. As a result, the efficiency of the removal of the water content can be enhanced. Further, at this time, the alcohol purge step is performed without heating the interior of the process chamber 201 to the temperature at which the water content is not remained in the process chamber 201, when the water content generated in the process chamber 201 exists alone. With such a configuration, the procedure of the cleaning process can be simplified. In addition, time by the completion of a removal of the water content from the process chamber 201 after the etching step, can be shortened. As a result, required time of whole cleaning process can easily be shortened.

In the alcohol purge step, the APC valve 244 is appropriately adjusted so that the pressure in the process chamber 201 is set to a pressure within range of, e.g., 67 to 53329 Pa (0.5 Torr to 400 Torr), preferably 67 to 26664 Pa (0.5 Torr to 200 Torr).

In addition, supply flow rates of $CH_3OH$ controlled by the MFCs 241$i$ and 241$j$ are set to flow rates within range of, e.g., 500 to 4000 sccm, and preferably 1000 to 4000 sccm, respectively.

Other process conditions are the same as those of the etching step.

In this way, the alcohol purge step is performed under the condition that the water content remains in the process chamber 201, when the water content exists alone in the process chamber 201, e.g., under the temperature lower than the boiling point of this water content, or under the pressure as not to get this water content being boiled, similarly to the etching step.

As an alcohol, respective alcohol exemplified in the etching step in addition to $CH_3OH$. The inventors of the present disclosure have found that in the alcohol purge step, the abovementioned effects can be obtained much easier when isopropyl alcohol (($CH_3)_2CHOH$) is supplied into the process chamber 201 as a replacement of $CH_3OH$. Namely, in the alcohol purge step, the inventors of the present disclosure have found that the water content can be removed from the process chamber 201 more efficiently in supplying $(CH_3)_2CHOH$ into the process chamber 201 compared with the case of supplying $CH_3OH$ into the process chamber 201. A fact that an azeotropic mixture of $(CH_3)_2CHOH$ and the water content evaporates in lower temperature as compared to an azeotropic mixture of $CH_3OH$ and the water content, can be regarded as a factor. In addition, a fact that an intermolecular bonding force of $(CH_3)_2CHOH$ is lower than an intermolecular bonding force of $CH_3OH$, can also be regarded as a factor.

(Purging and Returning to Atmospheric Pressure)

When the removal of the water content from the process chamber 201 is terminated, the valves 243$i$ and 243$j$ are closed to stop the supply of $CH_3OH$ into the process chamber 201. Then, the valves 243$f$ to 243$h$ are opened to flow $N_2$ gas through the gas supply pipes 232$f$ to 232$h$ respectively into the process chamber 201, and $N_2$ gas is exhausted through the exhaust pipe 231. $N_2$ gas acts as a purge gas. Thus, the interior of the process chamber 201 is purged. At this time, in some embodiment, the interior of the process chamber 201 is purged intermittently by repeating the opening/closing operation of the valves 243$f$ to 243$h$ (cycle purge). Thereafter, the atmosphere in the process chamber 201 is substituted with $N_2$ gas (inert gas substitution), and the pressure in the process chamber 201 returns to normal pressure (return to atmospheric pressure).

(Boat Unloading)

The seal cap 219 is descended by the boat elevator 115 to open the lower end of the manifold 209. The empty boat 217 is transferred through the lower end of the manifold 209 out of the reaction tube 203 (boat unloading). Further, when the amount of deposits adhered to the inner wall and the like of the nozzles 249$a$ and 249$b$ is high, the nozzles 249$a$ and 249$b$ are changed if necessary. When these series of steps are terminated, the abovementioned film forming process is resumed.

The abovementioned cleaning process in the present embodiment, i.e., the process of performing the etching step and the alcohol purge step continuously without providing an intermittent period therebetween, can be expressed as the process including:

a step of supplying HF gas and $CH_3OH$ into the process container (the process chamber 201);

a step of stopping supply of HF gas into the process chamber 201 in a state where supply of $CH_3OH$ into the process chamber 201 is continued; and a step of continuing supply of $CH_3OH$ into the process chamber 201 in a state where supply of HF gas into the process chamber 201 is stopped, wherein these steps are continuously performed without providing an intermittent period therebetween.

(4) Effect Obtained by this Embodiment

According to this embodiment, one or a plurality of effects are obtained as follows.

(a) After the film forming process of forming the SiO film on the wafer 200 is performed, by performing the etching step supplying at least HF gas into the process chamber 201, the deposits adhered to the surface of the members in the process chamber 201 can be removed. With this configuration, it is possible to improve the quality of film forming performed thereafter.

(b) In the etching step, it is possible to accelerate the etching reaction by HF gas, by supplying $CH_3OH$ together with HF gas. With this configuration, it is possible to increase the etching rate of the deposits and enhance the cleaning action. Further, even when a process condition such as temperature or pressure in the process chamber 201, is set to condition of low temperature or low pressure side (e.g., under a normal temperature), the deposits can be removed with high etching rate. According to these result, required time for the etching step, i.e., whole cleaning process can be shortened, and down-time of the substrate processing apparatus can be shortened.

(c) Since the etching of the deposits can be performed under non-plasma atmosphere, the configuration of the substrate processing apparatus can be simplified, and its manufacturing cost and maintenance cost can be reduced. Further, it is possible to avoid a plasma damages to the members in the process chamber 201.

(d) By performing the alcohol purge step after the etching step is having performed, the water content can be removed from the process chamber 201. With this configuration, it is possible to suppress the corrosion of the metal members in the process chamber 201 due to the residual water content, and avoid a generation of particles in the process chamber 201 due to the corrosion.

(e) In the alcohol purge step, by supplying $CH_3OH$ into the process chamber 201, the removal efficiency of the water content from the process chamber 201 can be enhanced. With this configuration, required time for the alcohol purge step, i.e., whole cleaning process can be shortened, and down-time of the substrate processing apparatus can be shortened.

(f) In the etching step and the alcohol purge step, i.e., in a state where HF gas and/or the water content remain in the process chamber 201, a corrosion of the metal members in the process chamber 201 can be surely suppressed by maintaining the temperature in the process chamber 201 to a temperature within range of abovementioned low temperature zone (0 to 100 degrees C.). In contrast, during or after the performance of the etching step, i.e., in a state where HF gas and/or the water content remain in the process chamber 201, when the interior of the process chamber is heated to about 800 degrees C., e.g., a reaction between the residual HF gas in the process chamber 201 and the water content is accelerated, and the metal members in the process chamber 201 may be corroded.

(g) By performing the etching step and the alcohol purge step continuously without providing an intermittent period therebetween, the procedure of the cleaning process can be simplified. In addition, after the etching step is performed, time by the completion of a removal of the water content from the process chamber 201 can be shortened. As a result, time required for whole cleaning process can be easily shortened.

(h) By performing the cleaning process in the abovementioned temperature zone, a work on the nozzle change and etc. after the cleaning process can be started immediately without changing the temperature (e.g., lowering the temperature) of the process chamber 201. As a result, a down-time of the substrate processing apparatus can be shortened.

(i) The abovementioned effects can be similarly obtained in a case of using a gas other than HCDS gas as the source gas, in a case of using a gas other than $O_2$ gas as the O-containing gas, and in a case of using a gas other than $H_2$ gas as the H-containing gas, as well. In addition, the abovementioned effects can also be similarly obtained in a case of using alcohol other than $CH_3OH$ as the alcohol.

(5) Modified Example of Cleaning Process

The cleaning process in this embodiment is not limited to the abovementioned forms but may be altered as the following modified example.

Modified Example 1

Figure 6A:
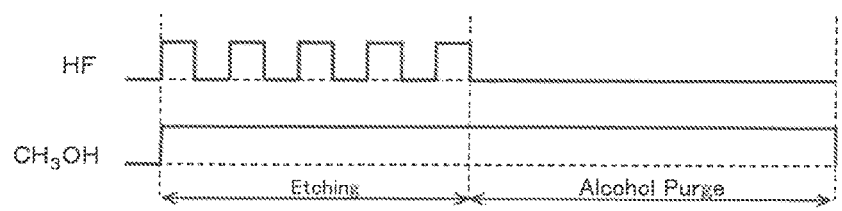
FIG. 6A is a view illustrating gas supply timings in a cleaning sequence of modified example 1 according to one embodiment of the present disclosure.

As shown in a cleaning sequence of FIG. 6A, in the etching step, HF gas may be supplied into the process chamber 201 intermittently. Further, $CH_3OH$ is supplied into the process chamber 201 continuously without providing an intermittent period from the etching step to the alcohol purge step in this modified example as well.

In this modified example, the effect similar to the effect of the cleaning sequence shown in FIG. 5 can be obtained. In addition, by supplying HF gas intermittently, an amount of water content and $SiF_4$ in the process chamber 201 can be controlled appropriately and an environment capable of providing an etching reaction easily in progress. Further, by supplying HF gas intermittently, a pressure fluctuation can be caused in the process chamber 201 and an impact associated with the pressure fluctuation can be imparted against deposits. In this way, cracks and separations, etc., are generated in the deposits and etching of the deposits can be efficiently progressed.

Modified Example 2

Figure 6B:
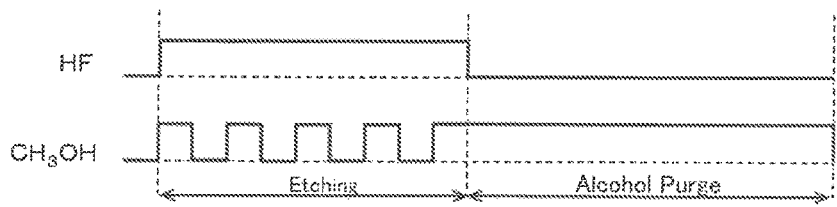
FIG. 6B is a view illustrating gas supply timings in a cleaning sequence of modified example 2 according to one embodiment of the present disclosure.

As shown in a cleaning sequence of FIG. 6B, in the etching step, $CH_3OH$ may be supplied into the process chamber 201 intermittently. In this modified example, the etching step and the alcohol purge step are performed continuously without providing an intermittent period as well.

In this modified example, the effect similar to the effect of the cleaning sequence shown in FIG. 5 can be obtained. In addition, by supplying $CH_3OH$ intermittently, an amount of water content and $SiF_4$ in the process chamber 201 can be controlled appropriately and an environment capable of providing an etching reaction easily in progress. Further, by supplying $CH_3OH$ intermittently, a pressure fluctuation can be caused in the process chamber 201 and an impact associated with the pressure fluctuation can be imparted against deposits. In this way, cracks and separations, etc., are generated in the deposits and etching of the deposits can be efficiently progressed.

Modified Example 3

Figure 6C:
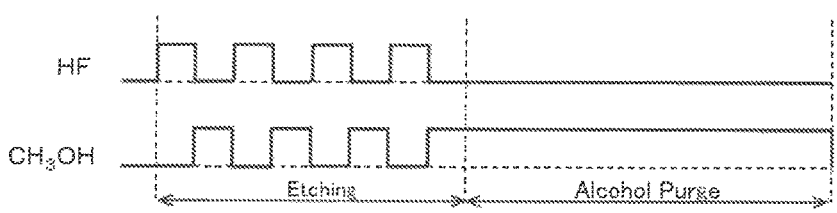
FIG. 6C is a view illustrating gas supply timings in a cleaning sequence of modified example 3 according to one embodiment of the present disclosure.

As shown in a cleaning sequence of FIG. 6C, in the etching step, HF gas and $CH_3OH$ may be supplied repeatedly and alternately into the process chamber 201 without providing a step of purging the interior of the process chamber 201 therebetween. In this modified example, the etching step and the alcohol purge step are performed continuously without providing an intermittent period as well. In this modified example, the effect similar to the effect of the cleaning sequence shown in FIG. 5 can be obtained.

Modified Example 4

Figure 6D:
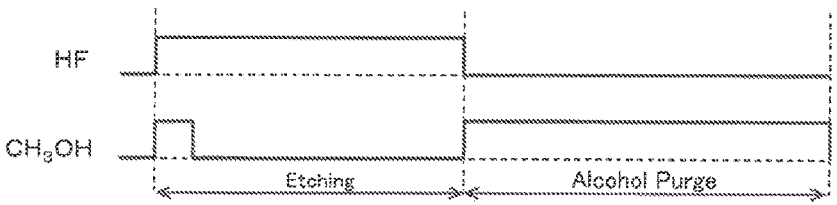
FIG. 6D is a view illustrating gas supply timings in a cleaning sequence of modified example 4 according to one embodiment of the present disclosure.

As shown in a cleaning sequence of FIG. 6D, in the etching step, $CH_3OH$ may be supplied into the process chamber 201 during an initial predetermined period of a period during which HF gas is supplied. In this case, the period of supplying $CH_3OH$ is set shorter than the period of supplying HF gas. In this modified example, the etching step and the alcohol purge step are performed continuously without providing an intermittent period as well.

In this modified example, the effect similar to the effect of the cleaning sequence shown in FIG. 5 can be obtained. In addition, in this modified example, supplying $CH_3OH$ in the initial period of the etching step may be the trigger for the etching reaction by HF gas. Then, by adjusting the timing of supplying this $CH_3OH$, it is possible to control a start timing of the etching reaction, i.e., a start point of cleaning.

Modified Example 5

Figure 6E:
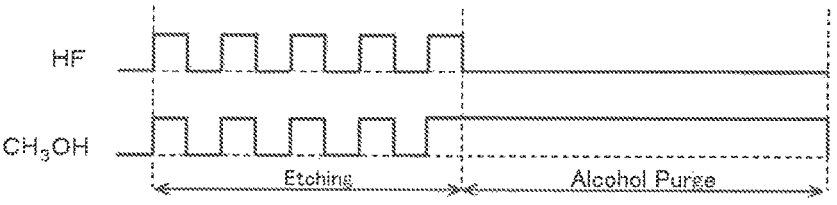
FIG. 6E is a view illustrating gas supply timings in a cleaning sequence of modified example 5 according to one embodiment of the present disclosure.

As shown in a cleaning sequence of FIG. 6E, in the etching step, simultaneous supply of HF gas and $CH_3OH$ into the process chamber 201 may be repeated intermittently. In this modified example, the etching step and the alcohol purge step are performed continuously without providing an intermittent period as well.

In this modified example, the effect similar to the effect of the cleaning sequence shown in FIG. 5 can be obtained. In addition, by repeating simultaneous supply of HF gas and $CH_3OH$ into the process chamber 201, an amount of water content and $SiF_4$ in the process chamber 201 can be controlled appropriately and an environment capable of providing an etching reaction easily in progress. Further, by repeating simultaneous supply of HF gas and $CH_3OH$ into the process chamber 201, a pressure fluctuation can be caused in the process chamber 201 and an impact associated with the pressure fluctuation can be imparted against deposits. In this way, cracks and separations, etc., are generated in the deposits and etching of the deposits can be efficiently progressed.

Modified Example 6

Figure 7A:
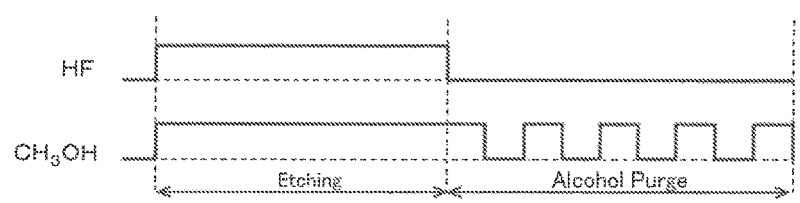
FIG. 7A is a view illustrating gas supply timings in a cleaning sequence of modified example 6 according to one embodiment of the present disclosure.

As shown in a cleaning sequence of FIG. 7A, in the alcohol purge step, $CH_3OH$ may be supplied into the process chamber 201 intermittently. In this modified example, the etching step and the alcohol purge step are performed continuously without providing an intermittent period as well. In this modified example, the effect similar to the effect of the cleaning sequence shown in FIG. 5 can be obtained. In addition, the use amount of $CH_3OH$ can be appropriately suppressed to further reduce costs of the cleaning process.

Modified Example 7

Figure 7B:
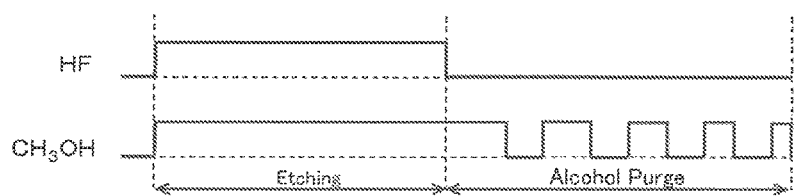
FIG. 7B is a view illustrating gas supply timings in a cleaning sequence of modified example 7 according to one embodiment of the present disclosure.

As shown in a cleaning sequence of FIG. 7B, in the alcohol purge step, $CH_3OH$ may be supplied into the process chamber 201 intermittently and gradually shorten the supply time at each time $CH_3OH$ is supplied. In this modified example, the etching step and the alcohol purge step are performed continuously without providing an intermittent period as well. In this modified example, the effect similar to the effect of the cleaning sequence shown in FIG. 5 can be obtained. In addition, the use amount of $CH_3OH$ can be appropriately suppressed to further reduce costs of the cleaning process.

Modified Example 8

Figure 7C:
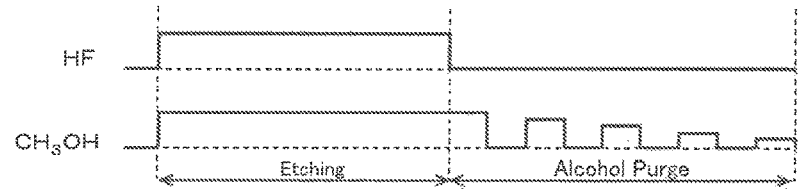
FIG. 7C is a view illustrating gas supply timings in a cleaning sequence of modified example 8 according to one embodiment of the present disclosure.

As shown in a cleaning sequence of FIG. 7C, in the alcohol purge step, $CH_3OH$ may be supplied into the process chamber 201 intermittently and gradually reduce the supply amount at each time $CH_3OH$ is supplied. In this modified example, the etching step and the alcohol purge step are performed continuously without providing an intermittent period as well. In this modified example, the effect similar to the effect of the cleaning sequence shown in FIG. 5 can be obtained. In addition, the use amount of $CH_3OH$ can be appropriately suppressed to further reduce costs of the cleaning process.

Other Embodiment of the Present Disclosure

As described above, embodiment of the present disclosure are specifically described. However, the present disclosure is not limited to the abovementioned embodiment, and can be variously modified in a range not departing from the gist of the disclosure.

For example, in the abovementioned embodiment, explanation is given for an example of supplying $CH_3OH$, i.e., the alcohol together with HF gas. However, the present disclosure is not limited to this embodiment. Namely, when supplying HF gas into the process chamber 201 in the etching step, the alcohol may not be flown, and etching of deposits may be performed by using HF gas alone, or HF gas diluted with $N_2$ gas. In this case, in the etching step, the etching rate of deposits can be appropriately suppressed.

Further, in the abovementioned embodiment, explanation is given for an example of performing the etching step and the alcohol purge step under a similar temperature (e.g., a room temperature). However, the present disclosure is not limited to this embodiment. Namely, the etching step and the alcohol purge step can be performed under different temperature respectively.

For example, the etching step may performed under a room temperature and the alcohol purge step may be performed under a temperature higher than the room temperature (e.g., 30 to 50 degrees C.). In this case, in the alcohol purge step, it is preferable in the point that an efficiency of removing a water content from the process chamber 201 can be enhanced. However, it is more preferable to perform the etching step and the alcohol purge step under a similar temperature (e.g., a room temperature) in the point that performing a step of changing the temperature (e.g., raising the temperature) of the interior of the process chamber 201 is not required between these steps. Namely, it is preferable in the point that the sequence of cleaning process can be simplified to further shorten the required time easily.

In addition, in the abovementioned embodiment, explanation is given for an example of supplying HF gas by using the nozzle 249b other than using the nozzle 249a which supplies HCDS gas. However, the present disclosure is not limited to this embodiment. Namely, when supplying HF gas by using the nozzle 249a, the effect similar to the effect of the abovementioned embodiment can be obtained. However, it is preferable to supply HF gas by using the nozzle other than the nozzle 249a for the following reasons mentioned.

This is because, when a film forming is performed, deposits mainly composed of SiO are adhered to the surface of the members in the process chamber 201, whereas deposits mainly composed of Si are adhered to the inside of the nozzle 249a. The reason for this is that HCDS gas and $H_2$ gas are flown into the nozzle 249a, whereas $O_2$ gas is not flown therein. Deposits mainly composed of Si have a characteristic that it is more difficult to be removed by HF than deposits mainly composed of SiO. Thus, it is difficult to remove deposits adhered to the inner wall of the nozzle 249a even HF gas is flown by using the nozzle 249a during the etching step.

Further, when supplying HF gas by using the nozzle 249a in the etching step, HF may enter into a space between deposits adhered to the inner wall of the nozzle 249a and the inner wall of the nozzle 249a, and a bonding condition between deposits and the inner wall may be unstable (become brittle). When a film forming is performed again in this state and HCDS gas or the like is flown into the nozzle 249a, deposits adhered to the inner wall of the nozzle 249a may partially be separated and become particles.

With these reasons, in the abovementioned embodiment, supply of HF gas is performed by using the nozzle 249a other than using the nozzle 249a which supplies HCDS gas. Further, with these reasons, in the abovementioned embodiment, in the etching step, $N_2$ gas is supplied into the nozzle 249a in order to prevent HF gas into the nozzle 249a from invading.

In addition, cleaning of the inside of the nozzle 249a, i.e., removal of deposits mainly composed of Si adhered to the inner wall of the nozzle 249a, is not required to be performed. The nozzle 249a may be changed when an accumulated film thickness of deposits reached the predetermined thickness which is a thickness before the deposits start separation and the particles start generating, e.g., a thickness of 4 to 5 μm. Further, in a film forming process, since only $O_2$ gas is flown into the nozzle 249b, deposits are not adhered to the inner wall of the nozzle 249b or if adhered, it is due to HCDS gas slightly invaded into the nozzle 249b. Therefore, the deposition amount is little as well. Thus, in the nozzle 249b, the necessity of the nozzle change is not high. However, the nozzle 249b may be changed as well when the nozzle 249a is changed.

In the abovementioned embodiment, explanation is given for an example of forming the SiO film on the wafer 200 under high-temperature condition by using HCDS gas, $O_2$ gas and $H_2$ gas. However, the present disclosure is not limited to this embodiment. For example, the present disclosure can be suitably used when forming the SiO film on the wafer 200 under middle-temperature condition by using the aminosilane source gas such as 3DMAS gas, BTBAS gas, or the like, or forming the SiO film on the wafer 200 under low-temperature condition by using the amine-based catalyst such as pyridine ($C_5H_5N$), or the like. Further, for example, the present disclosure can be suitably used when forming the SiO film on the wafer 200 under low-temperature condition by using aminosilane source gas such as BTBAS gas and plasma-excited $O_2$ gas. Namely, present disclosure can be suitable used when cleaning the process container after performing the process of forming the SiO film on the wafer 200 by film forming sequence shown below.

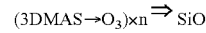

(3DMAS→$O_3$)×n ⇒ SiO

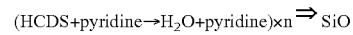

(HCDS+pyridine→$H_2O$+pyridine)×n ⇒ SiO

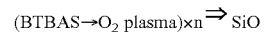

(BTBAS→$O_2$ plasma)×n ⇒ SiO

Further, for example, the present disclosure can be suitably used when forming Si-based oxide film such as silicon oxycarbonitride film (SiOCN film), silicon oxycarbide film (SiOC film), silicon oxynitride film (SiON film) on the wafer 200 as well, in addition to the case of forming the SiO film on the wafer 200.

Further, for example, the present disclosure can be suitably used when forming an oxide film including metallic element as well, in addition to the case of forming Si-based oxide film on the wafer 200. Namely, the present disclosure can be suitably used when cleaning the interior of the process container after having performed a process of forming a metal-based oxide film on the wafer 200.

As described, the present disclosure can be suitably used when cleaning the interior of the process chamber 201 by removing deposits including semiconductor-based oxide film such as Si-based oxide film, or metal-based oxide film. In these cases as well, the processing sequence and the process condition can be similar to the abovementioned embodiment. In these cases as well, the effect similar to the effect of the abovementioned embodiment and respective modified example can be obtained.

The recipe for use in film forming process and cleaning process (program in which procedures or process conditions are described) may be individually prepared based on contents of the process (the kind of film to be formed or removed, a composition ratio, a film quality, a film thickness, process procedure, process condition and the like), and may be preferably stored in the memory device 121c provided in the substrate processing apparatus via an electrical communication line or the external memory device 123 in which the recipes are recorded. In addition, when various process is initiated, the CPU 121a may appropriately select a suitable recipe among a plurality of recipes stored in the memory device 121c based on contents of the processing. With this configuration, thin films having a variety of film types, composition ratios, film qualities and film thicknesses can be formed or removed with high versatility and high reproducibility in one substrate processing apparatus. In addition, since an operator's work load (a load of inputting procedures, process conditions, or the like) can be lessened, it is possible to rapidly initiate various processing while avoiding an operational error.

The abovementioned recipe is not limited to a newly prepared recipe and may be prepared, for example, by modifying an existing recipe that is already installed in the substrate processing apparatus. When the recipe is modified, the modified recipe may be installed on the substrate processing apparatus via an electrical communication line or a recording medium in which the recipe is recorded. In addition, the recipe previously installed in the substrate processing apparatus may be directly changed by manipulating the input/output device 122 of the substrate processing apparatus.

In the abovementioned embodiment, an example of using a batch type substrate processing apparatus in which a plurality of substrates is processed at a time for forming a film has been illustrated. The present disclosure is not limited thereto but may be appropriately applied to a case in which a single-wafer type substrate processing apparatus which processes one or several substrates at a time is used to form a thin film. In addition, in the abovementioned embodiment, an example of using a substrate processing apparatus having a hot wall type processing furnace in forming a film. The present disclosure is not limited thereto but may be appropriately applied to a case in which a substrate processing apparatus having a cold wall type processing furnace is used to form a film. Even in these cases, process procedures and process conditions may be the same as those in the abovementioned embodiment.

Figure 10A:
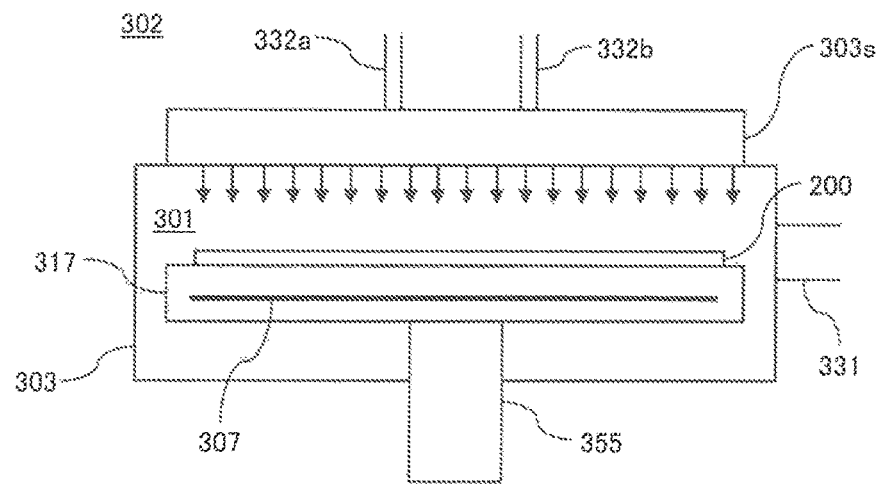
FIG. 10A is a schematic view illustrating a configuration of a vertical processing furnace of a substrate processing apparatus suitably used in another embodiment of the present disclosure, the processing furnace being shown in a longitudinal sectional view.

For example, the present disclosure may be appropriately applied to a case in which a substrate processing apparatus having a processing furnace 302 shown in FIG. 10A is used to form a film. The processing furnace 302 includes a process container 303 forming a process chamber 301, a shower head 303s which supplies a gas in the form of a shower into the process chamber 301, a support base 317 which supports one or several wafers 200 in a horizontal position, a rotary shaft 355 which supports the support base 317 from a bottom end of the support base 317, and a heater 307 installed in the support base 317. An inlet (gas introduction port) of the shower head 303s is connected with a gas supply ports 332a and 332b. The gas supply port 332a is connected with the gas supply system which is similar to the source gas supply system and H-containing gas supply system of the abovementioned embodiment. The gas supply port 332b is connected with the gas supply system similar to the O-containing gas supply system, the HF gas supply system and the alcohol supply system of the abovementioned embodiment. A gas distribution plate for supplying a gas in the form of a shower into the process chamber 301 is installed in an outlet (gas discharging port) of the shower head 303s. The shower head 303s is installed in a position opposite (a position in a facing state) to a surface of the wafer 200 carried into the process chamber 301. An exhaust port 331 for exhausting the interior of the process chamber 301 is installed in the process container 303. The exhaust port 331 is connected with an exhaust system which is similar to the exhaust system of the abovementioned embodiment.

Figure 10B:
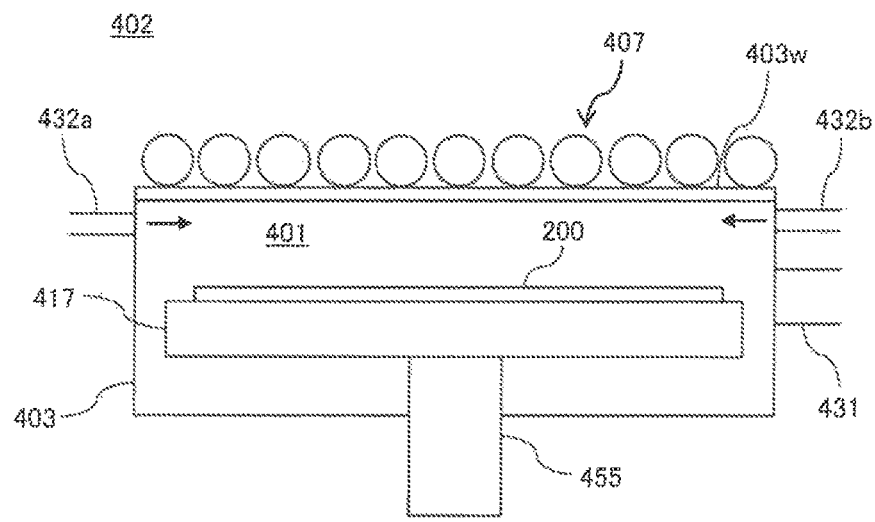
FIG. 10B is a schematic view illustrating a configuration of a vertical processing furnace of a substrate processing apparatus suitably used in another embodiment of the present disclosure, the processing furnace being shown in a longitudinal sectional view.

In addition, for example, the present disclosure may be appropriately applied to a case in which a substrate processing apparatus having a processing furnace 402 shown in FIG. 10B is used to form a film. The processing furnace 402 includes a process container 403 forming a process chamber 401, a support base 417 which supports one or several wafers 200 in a horizontal position, a rotary shaft 455 which supports the support base 417 from a bottom end of the support base 417, a lamp heater 407 which performs light irradiation on the wafer 200 in the process container 403, and a quartz window 403w which transmits the light from the lamp heater 407. The process container 403 is connected with a gas supply ports 432a and 432b. The gas supply port 432a is connected with the gas supply system which is similar to the source gas supply system and H-containing gas supply system of the abovementioned embodiment. The gas supply port 432b is connected with the gas supply system which is similar to the O-containing gas supply system, HF gas supply system and the alcohol supply system of the abovementioned embodiment. The gas supply ports 432a and 432b are respectively installed in an end of a side of the wafer 200 carried into the process chamber 401, namely, a position not opposite to a surface of the wafer 200 carried into the process chamber 401. An exhaust port 431 for exhausting the interior of the process chamber 401 is installed in the process container 403. The exhaust port 431 is connected with an exhaust system which is similar to the exhaust system of the abovementioned embodiment.

In a case of using these substrate processing apparatuses, a film forming process and a cleaning process can be performed with the same sequence and process conditions as the abovementioned embodiment and modified examples, and the effect similar to the effect of the abovementioned embodiment and modified example can be obtained.

In addition, the abovementioned embodiment and modified example may be used in proper combination. Process conditions at that time may be the same as those in the abovementioned embodiment.

EXAMPLE

The result of the experiment supporting the abovementioned effects obtained from the embodiment and the modified example will be described hereafter.

As an example, the substrate processing apparatus in the abovementioned embodiment was used to form SiO films on a plurality of wafers according to the film forming sequence shown in FIG. 4. HCDS gas was used as the source gas, $O_2$ gas was used as the O-containing gas and $H_2$ gas was used as the H-containing gas. Process conditions for film forming process were set to values within the range of the process conditions described in the abovementioned embodiment. Thereafter, according to the cleaning sequence shown in FIG. 5, the etching step (HF+Alcohol Etching) was performed to remove deposits adhered to the surface of the members in the process chamber 201, and the alcohol purge step (Alcohol PRG) was performed. HF gas was used as the cleaning gas and $CH_3OH$ was used as the alcohol. The cleaning temperature was set at a room temperature (R.T.). Other process conditions were set to values within the range of the process conditions described in the abovementioned embodiment. Thereafter, cycle purge ($N_2$PRG/VAC/$N_2$PRG/VAC) was performed, and thereafter, a replacement of the nozzle (Nozzle change) installed in the process container was performed.

As a comparative example, the substrate processing apparatus in the abovementioned embodiment was used to form SiO films on a plurality of wafers according to the film forming sequence shown in FIG. 4. Process procedures and process conditions were same as the process procedures and the process conditions in the abovementioned example. Thereafter, according to the process procedures and the process conditions in the abovementioned example, the etching step (HF+Alcohol Etching) was performed. Then, the temperature in the process container was raised to 800 degrees C. (heating) while the interior of the process container was exhausted without performing the alcohol purge step, and a water content was removed from the process container by performing cycle purge ($N_2$PRG/VAC/$N_2$PRG/VAC) to the interior of the process container. Then, after the temperature in the process container was lowered to normal temperature (cooling), a replacement of the nozzle (Nozzle change) installed in the process container was performed.

Figure 8A:
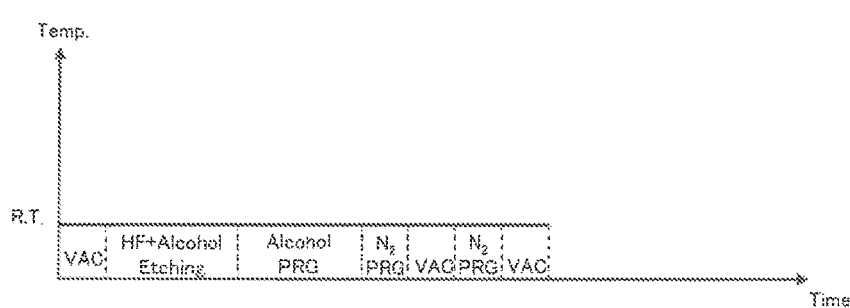
FIG. 8A is a view illustrating a progress until a completion of cleaning and cycle purge in the process container of the example.
Figure 8B:
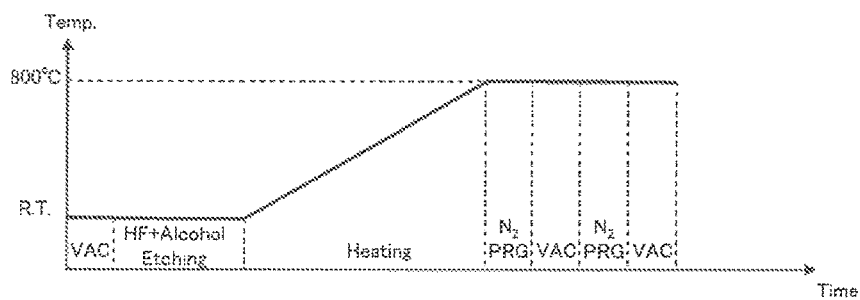
FIG. 8B is a view illustrating a progress until a completion of cleaning and cycle purge in the process container of the comparative example.
Figure 9A:
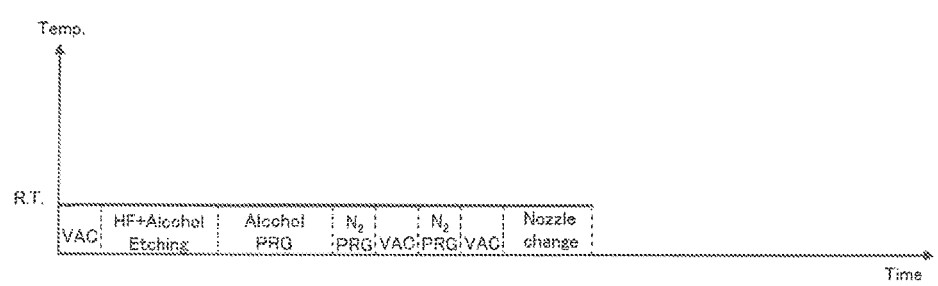
FIG. 9A is a view illustrating a progress until a completion of change of the nozzles installed in the process container of the example.
Figure 9B:
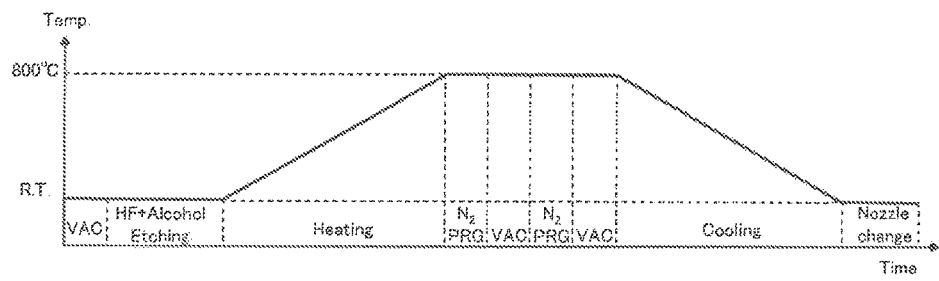
FIG. 9B is a view illustrating a progress until a completion of change of the nozzles installed in the process container of the comparative example.

FIG. 8A is a view illustrating a progress until a completion of cleaning and cycle purge in the process container of the example, and FIG. 8B is a view illustrating a progress until a completion of cleaning and cycle purge in the process container of the comparative example. In addition, FIG. 9A is a view illustrating a progress until a completion of change of the nozzles installed in the process container of the example, and FIG. 9B is a view illustrating a progress until a completion of change of the nozzle installed in the process container of the comparative example. In any one of the figures, the horizontal axis indicates time, and the vertical axis indicates the temperature in the process container. Further, in any one of the figures, an illustration of film forming process is abbreviated.

According to FIG. 8A and FIG. 8B, removal of water content from the process container in the example can be immediately terminated as compared to the comparative example, and as a result, required time from start of the etching step to completion of the cycle purge can be shortened. In addition, according to FIG. 9A and FIG. 9B, the nozzle change can be started quickly as compared to the comparative example, and as a result, required time from start of the etching step to completion of the nozzle change can be shortened. Namely, down-time of the substrate processing apparatus can be shortened in the example as compared to the comparative example.

Preferable Aspects of the Present Disclosure

Preferable aspects of the present disclosure will be supplementarily described hereafter.
(Supplementary Description 1)
According to other aspect, there is provided a method of cleaning an interior of a process container after having performed a process of forming an oxygen-containing film on a substrate, including:
(a) supplying a hydrogen fluoride gas and an alcohol into the process container; and
(b) supplying an alcohol into the process container in a state where supply of the hydrogen fluoride gas into the process container is stopped,
wherein (a) and (b) are continuously performed without providing an intermittent period therebetween.
(Supplementary Description 2)
According to other aspect, there is provided a method of cleaning an interior of a process container after having performed a process of forming an oxygen-containing film on a substrate, including:
(a) supplying a hydrogen fluoride gas and an alcohol into the process container; and
(b) stopping a supply of the hydrogen fluoride gas into the process container in a state where supply of the alcohol into the process container is kept,
wherein (a) and (b) are continuously performed without providing an intermittent period therebetween.

What is claimed is:

1. A method of cleaning an interior of a process container after having performed a process of forming an oxygen-containing film on a substrate, comprising:
   (a) supplying at least a hydrogen fluoride gas into the process container; and
   (b) supplying an alcohol into the process container in a state where supply of the hydrogen fluoride gas into the process container is stopped,
   wherein (a) and (b) are continuously performed without providing an intermittent period therebetween.

2. The method according to claim 1, wherein (a) and (b) are performed under a temperature at which water content remains in the process container when the water content generated in the process container in (a) exists alone.

3. The method according to claim 1, wherein (a) and (b) are performed under a similar temperature.

4. The method according to claim 1, wherein (a) and (b) are performed under a room temperature.

5. The method according to claim 1, wherein (a) and (b) are performed under a different temperature respectively.

6. The method according to claim 1, wherein the alcohol is further supplied into the process container in (a).

7. The method according to claim 6, wherein the alcohol is continuously supplied into the process container without providing an intermittent period from (a) to (b).

8. The method according to claim 6, wherein the alcohol is supplied into the process container during an initial predetermined period of a period during which the hydrogen fluoride gas is supplied in (a).

9. The method according to claim 1, wherein (b) is performed immediately after (a).

10. The method according to claim 1, wherein after (a), (b) is performed without supplying water content into the process container from the outside.

11. The method according to claim 1, wherein after (a), (b) is performed without performing purge by inert gas and vacuuming in the interior of the process container.

12. The method according to claim 1, wherein deposits including the oxygen-containing film adhered to the interior of the process container is removed in (a);
    and the water content generated in the process container during (a) is removed in (b).

13. A method of manufacturing a semiconductor device comprising:
    performing a process of forming an oxygen-containing film on a substrate in a process container; and
    cleaning an interior of the process container after having performed the process of forming the oxygen-containing film,
    wherein the act of cleaning the interior of the process container comprises:
    (a) supplying at least a hydrogen fluoride gas into the process container; and
    (b) supplying an alcohol into the process container in a state where supply of the hydrogen fluoride gas into the process container is stopped,
    wherein (a) and (b) are continuously performed without providing an intermittent period therebetween.

14. A substrate processing apparatus comprising:
    a process container in which a process of forming an oxygen-containing film on a substrate is performed;
    a hydrogen fluoride gas supply system configured to supply a hydrogen fluoride gas into the process container;
    an alcohol supply system configured to supply an alcohol into the process container; and
    a controller configured to control the hydrogen fluoride gas supply system and the alcohol supply system so as to perform cleaning an interior of the process container after having performed the process of forming the oxygen-containing film on a substrate, the act of cleaning the interior of the process container comprising:
    (a) supplying at least the hydrogen fluoride gas into the process container; and
    (b) supplying the alcohol into the process container in a state where supply of the hydrogen fluoride gas into the process container is stopped,
    wherein (a) and (b) are continuously performed without providing an intermittent period therebetween.

15. A non-transitory computer-readable recording medium storing a program that causes, by a computer, a substrate processing apparatus to execute cleaning an interior of a process container after having performed a process of forming an oxygen-containing film on a substrate, the act of cleaning the interior of the process container comprising:

(a) supplying at least a hydrogen fluoride gas into the process container; and
(b) supplying an alcohol into the process container in a state where supply of the hydrogen fluoride gas into the process container is stopped,
wherein (a) and (b) are continuously performed without providing an intermittent period therebetween.

* * * * *